(12) United States Patent
Pan et al.

(10) Patent No.: US 8,828,531 B2
(45) Date of Patent: Sep. 9, 2014

(54) EMISSIVE CERAMIC MATERIALS HAVING A DOPANT CONCENTRATION GRADIENT AND METHODS OF MAKING AND USING THE SAME

(75) Inventors: Guang Pan, Carlsbad, CA (US); Hiroaki Miyagawa, Oceanside, CA (US); Hironaka Fujii, Carlsbad, CA (US); Bin Zhang, San Diego, CA (US); Rajesh Mukherjee, Irvine, CA (US); Toshitaka Nakamura, Osaka (JP); Amane Mochizuki, Carlsbad, CA (US)

(73) Assignee: Nitto Denko Corporation, Osaka (JP)

( * ) Notice: Subject to any disclaimer, the term of this patent is extended or adjusted under 35 U.S.C. 154(b) by 338 days.

(21) Appl. No.: 13/306,797

(22) Filed: Nov. 29, 2011

(65) Prior Publication Data

US 2012/0141771 A1  Jun. 7, 2012

Related U.S. Application Data

(60) Provisional application No. 61/418,725, filed on Dec. 1, 2010.

(51) Int. Cl.
*B32B 3/26* (2006.01)
*B32B 18/00* (2006.01)
(Continued)

(52) U.S. Cl.
CPC ....... *C09K 11/7774* (2013.01); *C04B 2235/604* (2013.01); *C04B 2235/661* (2013.01); *C04B 2235/9646* (2013.01); *C04B 2235/3418* (2013.01); *C04B 35/638* (2013.01); *B32B 18/00* (2013.01); *C04B 35/44* (2013.01); *C04B 2235/441* (2013.01); *C04B 2235/5409* (2013.01); *C04B 2235/3229* (2013.01); *C04B 2235/6025* (2013.01); *C04B 2235/9653* (2013.01); *C04B 2237/582* (2013.01); *C04B 2237/586* (2013.01); *C04B 2237/704* (2013.01); *C04B 35/6268* (2013.01); *H01L 33/505* (2013.01); *C04B 2235/75* (2013.01); *C04B 2237/343* (2013.01); *C04B 2235/6581* (2013.01); *H01L 33/502* (2013.01); *C04B 2235/663* (2013.01); *C04B 2235/3225* (2013.01); *C04B 2235/6562* (2013.01); *C04B 2235/9661* (2013.01); *C04B 35/62665* (2013.01); *C04B 2235/764* (2013.01); *C04B 2235/6565* (2013.01); *C04B 35/6261* (2013.01)
USPC .................. 428/304.4; 264/21; 252/301.4 R; 501/152; 501/153; 428/310.5; 428/319.1

(58) Field of Classification Search
None
See application file for complete search history.

(56) References Cited

U.S. PATENT DOCUMENTS 5,164,798 A   11/1992  Huang
5,998,925 A   12/1999  Shimizu et al.
(Continued)

FOREIGN PATENT DOCUMENTS

CN   101 181 798   5/2008
EP   0936682 A1   8/1999
(Continued)

OTHER PUBLICATIONS

Crank et al., "The Mathematics of Diffusion," Oxford University Press, 1956, London.
(Continued)

*Primary Examiner* — David Sample
(74) *Attorney, Agent, or Firm* — Knobbe Martens Olson & Bear LLP

(57) ABSTRACT

Disclosed herein are emissive ceramic materials having a dopant concentration gradient along a thickness of a yttrium aluminum garnet (YAG) region. The dopant concentration gradient may include a maximum dopant concentration, a half-maximum dopant concentration, and a slope at or near the half-maximum dopant concentration. The emissive ceramics may, in some embodiments, exhibit high internal quantum efficiencies (IQE). The emissive ceramics may, in some embodiments, include porous regions. Also disclosed herein are methods of make the emissive ceramic by sintering an assembly having doped and non-doped layers.

19 Claims, 24 Drawing Sheets

(51) Int. Cl.
*C09K 11/00* (2006.01)
*C09K 11/80* (2006.01)
*C09K 11/77* (2006.01)
*C04B 35/638* (2006.01)
*C04B 35/44* (2006.01)
*C04B 35/626* (2006.01)
*H01L 33/50* (2010.01)

(56) References Cited

U.S. PATENT DOCUMENTS

| | | | |
|---|---|---|---|
| 6,069,440 | A | 5/2000 | Shimizu et al. |
| 6,844,285 | B1 | 1/2005 | Wei |
| 7,161,294 | B2 | 1/2007 | Chin et al. |
| 7,250,715 | B2 | 7/2007 | Mueller et al. |
| 7,361,938 | B2 | 4/2008 | Mueller et al. |
| 7,514,721 | B2 | 4/2009 | Krames et al. |
| 7,767,261 | B2 | 8/2010 | Kunze et al. |
| 2004/0145308 | A1 | 7/2004 | Rossner et al. |
| 2004/0256974 | A1 | 12/2004 | Mueller-Mach et al. |
| 2005/0137078 | A1 | 6/2005 | Anderson et al. |
| 2005/0168137 | A1 | 8/2005 | Adamovich et al. |
| 2005/0269582 | A1 | 12/2005 | Mueller et al. |
| 2006/0267500 | A1 | 11/2006 | Chau et al. |
| 2006/0284196 | A1 | 12/2006 | Setlur et al. |
| 2007/0126017 | A1 | 6/2007 | Krames et al. |
| 2007/0176539 | A1 | 8/2007 | Mathai et al. |
| 2007/0215890 | A1 | 9/2007 | Harbers et al. |
| 2007/0263969 | A1* | 11/2007 | Huang et al. .......... 385/123 |
| 2008/0118724 | A1 | 5/2008 | Cina et al. |
| 2008/0211389 | A1 | 9/2008 | Oshio |
| 2009/0108507 | A1 | 4/2009 | Messing et al. |
| 2009/0212697 | A1 | 8/2009 | Nakamura et al. |
| 2010/0012964 | A1 | 1/2010 | Copic et al. |
| 2010/0067214 | A1 | 3/2010 | Hoelen et al. |
| 2010/0096622 | A1 | 4/2010 | Iizumi et al. |
| 2010/0276717 | A1 | 11/2010 | Boerkekamp et al. |
| 2011/0116263 | A1 | 5/2011 | Cillessen et al. |
| 2011/0227477 | A1 | 9/2011 | Zhang et al. |
| 2012/0001214 | A1 | 1/2012 | Ooyabu et al. |
| 2012/0068213 | A1 | 3/2012 | Zhang et al. |
| 2013/0234587 | A1 | 9/2013 | Zhang et al. |
| 2013/0313967 | A1 | 11/2013 | Zhang et al. |

FOREIGN PATENT DOCUMENTS

| | | |
|---|---|---|
| EP | 1139440 A2 | 10/2001 |
| EP | 1278250 A2 | 1/2003 |
| EP | 1473784 A2 | 11/2004 |
| JP | 2009/177106 A | 8/2009 |
| WO | WO 2007/062136 A1 | 5/2007 |
| WO | WO 2007/107917 A2 | 9/2007 |
| WO | WO 2008/056292 A1 | 5/2008 |
| WO | WO 2008/149256 | 12/2008 |
| WO | WO 2009/038674 A2 | 3/2009 |
| WO | WO 2010/010484 | 1/2010 |
| WO | WO 2011/097137 A1 | 8/2011 |
| WO | WO 2011/115820 | 9/2011 |
| WO | WO 2012/040046 A1 | 3/2012 |
| WO | WO 2012/075018 | 6/2012 |
| WO | WO 2013/134163 | 8/2013 |

OTHER PUBLICATIONS

Ohkubo et al., "Absolute Fluorescent Quantum Efficiency of NBS Phosphor Standard Samples," 87-93, J. Illum Eng Inst. Jpn. vol. 83, No. 83, No. 2, 1999.

International Search Report and Written Opinion for PCT/US2011/062411 mailed Feb. 14, 2012.

Sakaguchi, I. et al., "Effect of Composition on the Oxygen Tracer Diffusion in Transparent Yttrium Aluminum Garnet (YAG) Ceramics" Journal of American Chemical Society, vol. 79(6), pp. 1627-1633 (1995).

* cited by examiner (1) Breadboard (12" x 24")
(2) Construction rail
(3) Drop-in rail carriage
(4) Translation stages
(5) 360 degree rotation platform
(6) Translating post
(7) Integrating sphere
(8) Sample holder

EMISSIVE CERAMIC MATERIALS HAVING A DOPANT CONCENTRATION GRADIENT AND METHODS OF MAKING AND USING THE SAME

CROSS-REFERENCE TO RELATED APPLICATIONS

This application claims the benefit of priority to U.S. Application No. 61/418,725, filed Dec. 1, 2010, which is hereby incorporated by reference in its entirety.

BACKGROUND

1. Field

The present application relates to emissive ceramic materials having a dopant concentration.

2. Description of the Related Art

Solid state light emitting devices such as light emitting diode (LED), organic light emitting diode (OLED) or sometimes called organic electroluminescent device (OEL), and inorganic electroluminescent device (IEL) have been widely utilized for various applications such as flat panel display, indicator for various instrument, signboard, and ornamental illumination, etc. As the emission efficiency of these light emitting devices continues to improve, applications that require much higher luminance intensity, such as automobile headlights and general lighting, may soon become feasible. For these applications, white-LED is one of the promising candidates and have attracted much attention.

Internal quantum efficiency (IQE) is the ratio of photons created by an emissive material to the photons absorbed by the same material. An increased IQE value can improve a lighting apparatus's energy efficiency; however, there is still no reliable method for increasing IQE without also diminishing the luminance efficiency. Thus, there is a need for new emissive materials that can overcome these limitations regarding IQE.

SUMMARY

Some embodiments disclosed herein are emissive ceramic materials having a dopant concentration gradient along a thickness of a yttrium aluminum garnet (YAG) region.

Some embodiments disclosed herein are emissive ceramic materials having one or more porous regions.

Some embodiments disclosed herein include an emissive ceramic comprising a yttrium aluminum garnet (YAG) region and a dopant having a concentration gradient along a thickness of the YAG region between a first surface and a second surface, wherein said concentration gradient comprises a maximum dopant concentration, a first half-maximum dopant concentration, and a first slope at or near the first half-maximum dopant concentration, wherein an absolute value of the first slope is in the range of about 0.001 and about 0.004 (at %/μm).

In some embodiments, the maximum dopant concentration is in the range of about 0.25 at % to about 0.5 at %.

In some embodiments, the maximum dopant concentration is located no more than about 100 μm away from the first or second surface. In some embodiments, the maximum dopant concentration is located no more than about 100 μm away from the center of the thickness of the YAG region. In some embodiments, the first half-maximum dopant concentration is located at least about 25 μm away from the location of the maximum dopant concentration. In some embodiments, the first half-maximum dopant concentration is located at least 50 μm away from the first and second surfaces.

In some embodiments, the emissive ceramic includes a second half-maximum dopant concentration located at least 25 μm away from the location of the first half-maximum dopant concentration. In some embodiments, the second half-maximum dopant concentration is located at least 25 μm away from the location of the maximum dopant concentration.

In some embodiments, the emissive ceramic includes a second slope at or near the second half-maximum dopant concentration, wherein an absolute value of the second slope is in the range of 0.001 and 0.004 (at %/μm). In some embodiments, the absolute value of the first slope is about the same as the absolute value of the second slope.

In some embodiments, the dopant concentration gradient comprises a peak having a full-width at half-maximum in the range of about 50 μm to about 400 μm.

In some embodiments, the thickness of the YAG region is in the range of about 100 μm to about 1 mm.

In some embodiments, the YAG region further comprises a first porous region. In some embodiments, the first porous region has a pore volume in the range of about 0.5% to about 80%. In some embodiments, the first porous region has a pore volume in the range of about 1% to about 30%.

In some embodiments, the first porous region comprises pores having an average size in the range of about 0.5 μm to about 50 μM. In some embodiments, the pores have an average size in the range of about 1.0 μm to about 10 μm.

In some embodiments, the YAG region further comprises a first non-porous region and a second non-porous region, and wherein the first porous region is disposed between the first non-porous region and the second non-porous region.

In some embodiments, the YAG region further comprises a first non-porous region and a second porous region, and wherein the first non-porous region is disposed between the first porous region and the second porous region.

In some embodiments, the first porous region is located no more than about 100 μm away from the center of the thickness of the YAG region.

In some embodiments, the first porous region is located at least about 25 μm away from the center of the thickness of the YAG region.

In some embodiments, the first porous region is located at or near the first surface of the YAG region or the second surface of the YAG region.

In some embodiments, the YAG region is about the same size as the porous region.

In some embodiments, the first porous region has a thickness in the range of about 10 μm to about 400 μm.

In some embodiments, the first porous region is obtained by volatilizing organic particles within the YAG region or a precursor thereof.

Some embodiments disclosed herein include an emissive ceramic comprising a yttrium aluminum garnet (YAG) region and a dopant having a concentration gradient along a thickness of the YAG region, wherein said concentration gradient comprises a maximum dopant concentration, a first half-maximum dopant concentration, and a first slope at or near the first half-maximum dopant concentration, wherein an absolute value of the first slope is in the range of about one-eighth of the maximum dopant concentration divided by the thickness and about two times the maximum dopant concentration divided by the thickness.

In some embodiments, the maximum dopant concentration is located between about one-quarter and about three-quarters along the thickness of the YAG region. In some embodiments, the maximum dopant concentration is located at or near the center of the thickness of the YAG region.

In some embodiments, the maximum dopant concentration is located no more than one-tenth of the thickness apart from a first or second surface on opposite sides of the thickness of the YAG region.

In some embodiments, the maximum dopant concentration is in the range of about 0.25 at % to about 0.5 at %. In some embodiments, the first slope is in the range of 0.001 and 0.004 (at %/μm).

In some embodiments, said dopant concentration further comprises a second slope at or near a second half-maximum dopant concentration, wherein an absolute value of the second slope is in the range of about one-eighth of the maximum dopant concentration divided by the thickness and about two times the maximum dopant concentration divided by the thickness.

In some embodiments, the absolute value of the first and second slopes is about the same.

In some embodiments, the first half-maximum dopant concentration is at least about one-tenth of the thickness of the YAG region apart from both the first surface and the second surface, and wherein the first half-maximum dopant concentration is at least about one-tenth of the thickness apart from the maximum dopant concentration.

In some embodiments, the second half-maximum dopant concentration is at least about one-tenth of the thickness of the YAG region apart from both the first surface and the second surface, and wherein the second half-maximum dopant concentration is at least about one-tenth of the thickness apart from both the maximum dopant concentration and the first half-maximum concentration.

In some embodiments, the thickness of the YAG region is in the range of about 100 μm to about 1 mm.

In some embodiments, said dopant concentration gradient is generally symmetric about a point at or near the center of the YAG region.

In some embodiments, said dopant concentration gradient includes dopant concentrations that are effective to produce luminescence along substantially all of the thickness of the YAG region.

In some embodiments, dopant concentration gradient has an average dopant concentration in the range of about 0.01 at % to about 0.5 at %.

In some embodiments, a ratio of the maximum dopant concentration to the average dopant concentration is in the range of about 5:1 to about 1.5:1.

In some embodiments, said dopant concentration gradient further comprises a peak having a full-width at half-maximum in the range of about one-fifth of the thickness to about four-fifths of the thickness.

In some embodiments, the YAG region further comprises a first porous region.

In some embodiments, the first porous region has a pore volume in the range of about 0.5% to about 80%.

In some embodiments, the first porous region has a pore volume in the range of about 10% to about 30%.

In some embodiments, the first porous region comprises pores having an average size in the range of about 0.5 μm to about 50 μm. In some embodiments, the pores have an average size in the range of about 1.0 μm to about 10 μm.

In some embodiments, the YAG region further comprises a first non-porous region and a second non-porous region, and wherein the first porous region is disposed between the first non-porous region and the second non-porous region.

In some embodiments, the YAG region further comprises a first non-porous region and a second porous region, and wherein the first non-porous region is disposed between the first porous region and the second porous region.

In some embodiments, the first porous region is located no more than about 100 μm away from the center of the thickness of the YAG region.

In some embodiments, the first porous region is located at least about 25 μm away from the center of the thickness of the YAG region.

In some embodiments, the first porous region is located at or near the first surface of the YAG region or the second surface of the YAG region.

In some embodiments, the YAG region is about the same size as the porous region.

In some embodiments, the first porous region has a thickness in the range of about 10 μm to about 400 μm.

In some embodiments, the first porous region is obtained by volatilizing organic particles within the YAG region or a precursor thereof.

In some embodiments, the emissive ceramic exhibits an internal quantum efficiency (IQE) of at least about 0.80 when exposed to radiation having a wavelength of about 455 nm.

Some embodiments disclosed herein include a method of forming an emissive ceramic comprising sintering an assembly, wherein the assembly comprises a doped layer disposed on one side of a first non-doped layer, wherein: the doped layer comprises yttrium aluminum garnet (YAG), a YAG precursor, or combination thereof, and a dopant, wherein the doped layer has a thickness in the range of about 10 μm to about 200 μm; the first non-doped layers comprises YAG, a YAG precursor, or combination thereof, wherein the first non-doped layer has a thickness in the range of about 40 μm to about 800 μm; and at least about 30% of the dopant in the doped layer diffuses out of the doped layer during said process.

In some embodiments, the doped layer is disposed between the first non-doped layer and a second non-doped layer comprising YAG, a YAG precursor, or combination thereof, and wherein the first and second non-doped layers each independently have a thickness in the range of about 40 μm to about 400 μm.

In some embodiments, at least a portion of the dopant in the doped layer diffuses into both the first and the second non-doped layers during the sintering.

In some embodiments, no more than about 80% of the dopant in the doped layer diffuses out of the doped layer during said process.

In some embodiments, the doped layer has a thickness in the range of about 40 μm to about 80 μm.

In some embodiments, the thickness of the first non-doped layer is about the same the thickness of the second non-doped layer; and both the thickness of the first non-doped layer and the thickness of the second non-doped layer is greater than the thickness of the doped layer.

In some embodiments, the thickness of the first non-doped layer is less than the thickness of the second non-doped layer; and the thickness of the second non-doped layer is greater than or equal to the thickness of the doped layer.

In some embodiments, the assembly has a total thickness in the range of about 100 μm to about 1 mm.

In some embodiments, the doped layer comprises about 0.1 at % to about 5 at %.

In some embodiments, a first amount of dopant in the doped layer diffuses into the first non-doped layer during said process; a second amount of dopant in the doped layer diffuses into the second non-doped layer during said process; and the ratio of the first amount of dopant to the second amount of dopant is in the range of about 4:1 to about 1:4.

In some embodiments, the first amount of dopant is about the same as the second amount of dopant.

In some embodiments, sintering said assembly comprises heating the assembly at a temperature in the range of about 1000° C. to about 1900° C. for at least about 2 hrs.

In some embodiments, said temperature is in the range of about 1300° C. to about 1800° C.

In some embodiments, the assembly is heated at said temperature for at least about 5 hours.

In some embodiments, the assembly is heated at said temperature for no more than about 20 hours.

In some embodiments, at least one of the doped layer or the first non-doped layer comprises organic particles.

In some embodiments, the organic particles comprise a polymer.

In some embodiments, the organic particles have a largest diameter in the range of about 0.5 µm to about 50 µm.

In some embodiments, said at least one of the doped layer and the first non-doped layer comprises an amount of organic particles in the range of about 0.5% by volume to about 80% by volume.

In some embodiments, the doped layer comprises the organic particles. In some embodiments, the first non-doped layer comprises the organic particles. In some embodiments, each layer of the assembly comprises the organic particles. In some embodiments, at least one layer in the assembly is substantially free of the organic particles.

Some embodiments disclosed herein include an emissive ceramic made by the any of the methods disclosed herein.

In some embodiments, the emissive ceramic exhibits an internal quantum efficiency (IQE) of at least about 0.80 when exposed to radiation having a wavelength of about 455 nm.

Some embodiments disclosed herein include a lighting apparatus comprising: a light source configured to emit blue radiation; and any of the emissive ceramics disclosed herein, wherein the emissive ceramic is configured to receive at a least a portion of the blue radiation.

Some embodiments disclosed herein include a method of producing light comprising exposing any one of the emissive ceramics disclosed herein to a blue radiation.

DETAILED DESCRIPTION

Disclosed herein are emissive ceramic materials that can provide superior internal quantum efficiency by including a dopant concentration gradient along at least one dimension. Applicants have surprisingly discovered a dopant concentration profile, under certain conditions, provides superior internal quantum efficiency. The emissive ceramics may optionally include one or more porous regions. Also disclosed herein are methods of making emissive ceramics that include a dopant concentration profile. In addition, the present application includes lighting apparatuses having the emissive ceramic material and methods of using the emissive ceramic material.

Emissive Ceramics

Some embodiments disclosed herein include an emissive ceramic having an yttrium aluminum garnet (YAG) region and a dopant having a concentration gradient along the thickness of the YAG region. The emissive ceramic may, for example, be prepared by sintering an assembly. Therefore, an "emissive ceramic" generally describes the final emissive material that can be used for lighting purposes, while an "assembly" is a composite that may be sintered to form the emissive ceramic. As will be discussed further below, sintering an assembly is one method for causing dopant diffusion that forms a dopant concentration gradient within the final emissive ceramic.

Figure 1A:
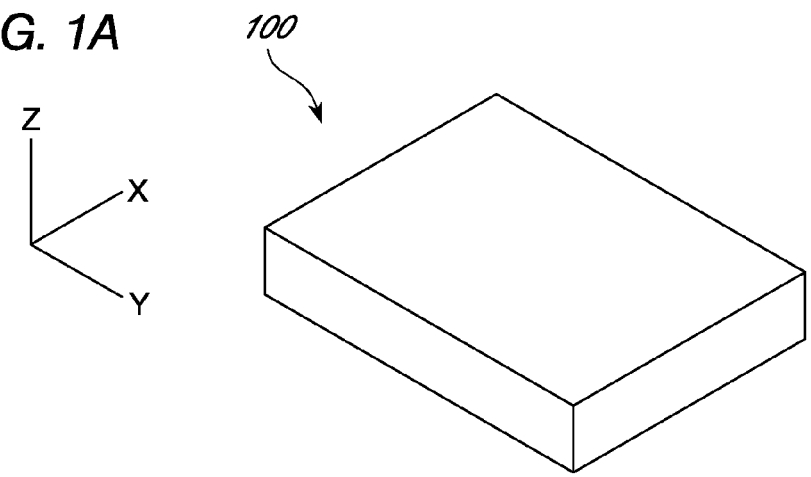
FIGS. 1A-C illustrate non-limiting examples of emissive ceramics.
Figure 1B:
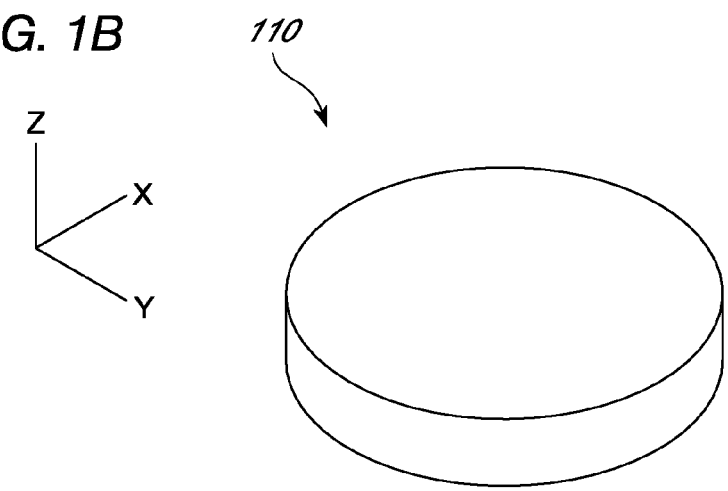
Figure 1C:
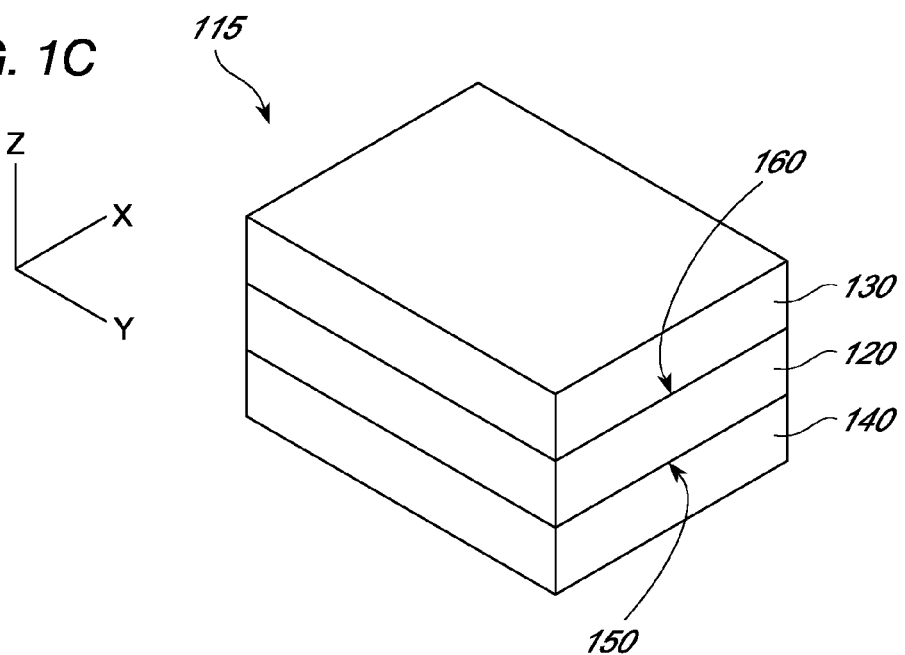

The emissive ceramics may include a dopant concentration gradient along "a thickness of a YAG region." FIGS. 1A-C show the thickness of the YAG region along the z-axis for various non-limiting examples of the emissive ceramic. FIG. 1A illustrates one non-limiting example of an emissive ceramic. Emissive ceramic 100 may contain a generally uniform distribution of an emissive dopant material within a yttrium aluminum garnet host material and includes a length, width, and thickness along the x-axis, y-axis, and z-axis, respectively. In some embodiments, the thickness of the YAG region is the smallest dimension of the emissive ceramic. For example, the emissive ceramic may have both the length and width equal to about 1 mm, and a thickness of about 100 μm. In some embodiments, the thickness is not the smallest dimension. Of course, numerous other geometries are within the scope of the present application, which is not limited to the generally cuboid geometry portrayed in FIG. 1A. For example, the emissive ceramic may also be cylindrical, cubic, etc. Furthermore, there is no requirement that the emissive ceramic is symmetric, include clearly defined edges or a specific number of faces.

FIG. 1B illustrates another embodiment of an emissive ceramic. Emissive ceramic 110 may contain a generally uniform dispersion of yttrium aluminum garnet and has a cylindrical or disk-like geometry. Emissive ceramic 110 includes a thickness along the z-axis.

FIG. 1C illustrates some embodiments of an emissive ceramic that does not include a generally uniform dispersion of yttrium aluminum garnet throughout the emissive ceramic. Emissive ceramic 115 includes an emissive yttrium aluminum garnet region 120 interposed between two non-YAG regions 130 and 140 (e.g., region consisting of aluminum oxide). Interface 150 is between emissive yttrium aluminum garnet region 120 and non-YAG region 140. Similarly, interface 160 is between emissive yttrium aluminum garnet region 120 and non-YAG region 130. In this embodiment, the thickness of the yttrium aluminum garnet region does not include portions of non-YAG regions 130 and 140. The thickness of yttrium aluminum garnet region 120 is between surface 150 and surface 160 along the z-axis. The thickness of yttrium aluminum garnet region 120 is therefore less than the thickness of emissive ceramic 115.

Figure 2:
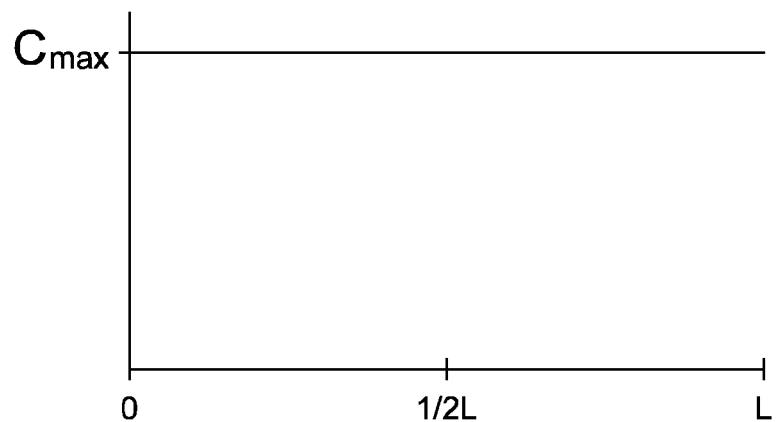
FIG. 2 is a graph showing a prior art example of a dopant concentration profile along the thickness of an yttrium aluminum garnet region.

FIG. 2 is a graph showing a prior art example of a dopant concentration profile along the thickness of an emissive yttrium aluminum garnet region. The horizontal axis is the position along the thickness of the emissive yttrium aluminum garnet region (e.g., along the z-axis of emissive ceramic 100 illustrated in FIG. 1A). The position '0' along the horizontal axis would be at a first surface of the emissive layer (e.g., the bottom face of emissive ceramic 100). The position '½L' along the horizontal axis would be at the midpoint along the thickness (e.g., at about the center along the thickness of emissive ceramic 100). The position 'L' on the horizontal axis would be at a second surface of the emissive layer that is opposite to the first surface along thickness (e.g., the top face of emissive ceramic 100). Accordingly, the first surface and the second surface are on opposite sides of the thickness (e.g., the bottom face and top face of emissive ceramic 100 are on opposite sides along the z-axis).

Meanwhile, the vertical axis in FIG. 2 is the dopant concentration at a given position along the thickness. This prior art dopant concentration profile has several notable features. First, the example generally includes a substantially constant dopant concentration profile along the thickness (i.e., the slope is about 0 along the entire thickness). Second, the dopant concentration profile has a maximum dopant concentration ($C_{max}$) found along substantially all of the thickness. Third, the minimum dopant concentration ($C_{min}$) is about the same as the maximum dopant concentration. Fourth, the dopant concentration is greater than half the maximum dopant concentration along substantially all of the thickness. In other words, the substantially constant dopant concentration profile does not include a half-maximum dopant concentration ($C_{max/2}$).

Figure 3:
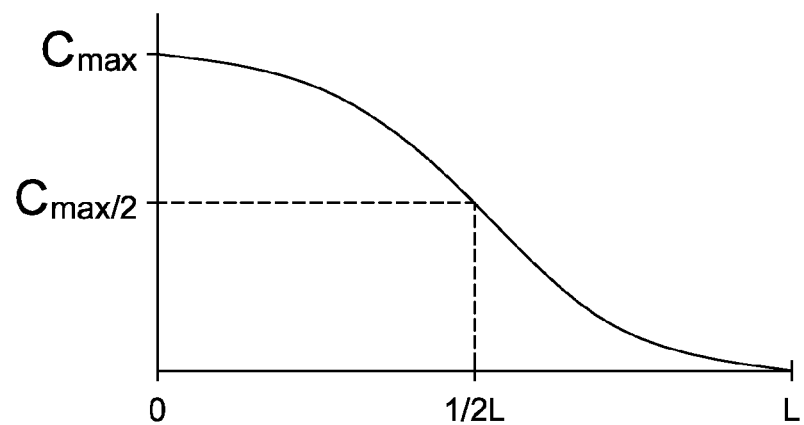
FIG. 3 is a graph showing one embodiment of a dopant concentration gradient that is within the scope of the present application.

FIG. 3 is a graph showing one embodiment of a dopant concentration gradient that is within the scope of the present application. A maximum dopant concentration is located at or near a first surface of the yttrium aluminum garnet region, while a minimum dopant concentration is located at or near a second surface that is opposite to the first surface along the thickness. Also, a half-maximum dopant concentration is located at or near the center of the yttrium aluminum garnet region.

In contrast to the substantially constant dopant concentration profile in FIG. 2, the dopant concentration gradient depicted in FIG. 3 has a varying slope that includes non-zero values. As used herein, the term "slope" means the rate of change of the concentration relative to the change in position along the thickness (e.g., horizontal axis in FIG. 2). If the dopant concentration can be reasonably represented by a continuous function f(x), then the slope may be determined from the derivative of this function. As an example, the absolute value of the slope at about ½L (or at about the half-maximum dopant concentration) in FIG. 3 is more than about the maximum dopant concentration divided by the thickness of the yttrium aluminum garnet region ($C_{max}/L$).

Figure 4:
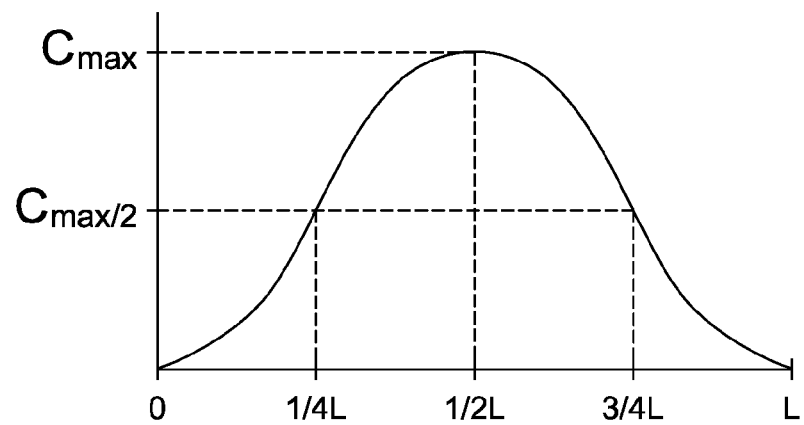
FIG. 4 is a graph showing another embodiment of a dopant concentration gradient that is also within the scope of the present application.

FIG. 4 is a graph showing another embodiment of a dopant concentration gradient that is also within the scope of the present application. A maximum dopant concentration is at or near the center of the yttrium aluminum garnet region, while minimum dopant concentrations are located at or near the first and the second surfaces that are on opposite sides along the thickness. Also, two half-maximum dopant concentrations are located at about one-quarter of L (i.e., ¼L) and three-quarters of L. In this embodiment, both half-maximum dopant concentrations have slopes with about the same magnitude. The dopant concentration gradient also exhibits non-zero values (or more than trace amounts) for the dopant concentration along substantially all of the thickness.

The dopant concentration gradient for the embodiment shown in FIG. 4 is also generally symmetric about the center of the yttrium aluminum garnet region. In other words, if the dopant concentration gradient could be reasonably represented by a continuous function f(x), then f(½L−z) would be about the same as f(½L+z) for 0≤z≤½L. The dopant concentration gradient may also be characterized by a single peak.

This peak has a full-width at half-maximum (e.g., the distance between the two half-maximum dopant concentrations along the thickness) of about ½L (i.e., ¾L minus ¼L)

Another feature that may be used to characterize the dopant concentration gradient is the average dopant concentration. The average dopant concentration may be determined by summing a series of evenly distributed concentrations along the entire thickness and dividing this sum by the total number of concentrations used in the summation. Alternatively, if the dopant concentration gradient can be reasonably represented by a continuous function f(x), the average dopant concentration may be equal to $$\int_0^L \frac{f(x)dx}{L}.$$

As a simple example, the average dopant concentration for the profile illustrated in FIG. 2 would be the maximum dopant concentration. In contrast, both FIGS. 3 and 4 illustrate average concentration profiles that are less than the maximum dopant concentration.

As would be appreciated by those skilled in the art, FIGS. 2-4 represent simplified illustrations of dopant concentration profiles. Various factors should be considered when comparing these profiles with experimental results. For example, one may need to account for noise that distorts the measured dopant concentration. This may require manipulating the data to reduce distortions using various methods known in the art (e.g., using Fourier transforms, averaging measurements, etc.). Similarly, additional distortions may arise due to surface-effects or minor defects in the material. The skilled artisan can recognize these distortions and appreciate that these differences are not distinguishing features from the illustrated dopant concentration gradients disclosed herein.

Maximum Dopant Concentration

Some embodiments of the emissive ceramic include a dopant concentration gradient having a maximum dopant concentration. Applicants have found the maximum dopant concentration may correlate with the internal quantum efficiency. Without being bound to any particular theory, it is believed that a high maximum dopant concentration results in excessive quenching that diminishes efficiency. Furthermore, a low maximum dopant concentration reduces efficiency because there are a reduced number of emissive centers, which in terms limits the ability to create photons.

Thus, in some embodiments, the maximum dopant concentration is in the range of about 0.1 atomic % (at %) to about 1 at %. The maximum dopant concentration may, for example, be at least about 0.1 at %; at least about 0.2 at %; at least about 0.25 at %; at least about 0.275 at %; at least about 0.28 at %; or at least about 0.3 at %. The maximum dopant concentration may, for example, be no more than about 1 at %; no more than about 0.75 at %; no more than about 0.5 at %; no more than about 0.4 at %; or no more than about 0.3 at %.

The maximum dopant concentration may be located at one or more positions along the thickness of the yttrium aluminum garnet region. In some embodiments, the maximum dopant concentration is located apart from a first and second surface on opposite sides of the thickness. For example, the maximum dopant concentration may be location between about one-quarter of the thickness and about three-quarters of the thickness along the thickness of the yttrium aluminum garnet region. As an example, if the thickness of the yttrium aluminum garnet region is about 100 µm, then the maximum dopant concentration may be located between about 25 µm and about 75 µm along the thickness.

The maximum dopant concentration may, in some embodiments, be located at position along the thickness that is at least about one-third of the thickness; at least about three-eighths of the thickness; at least about two-fifths of the thickness; at least about three-sevenths of the thickness; or at least about four-ninths of the thickness. The maximum dopant concentration may, in some embodiments, be located at position along the thickness that is at no more than about two-thirds of the thickness; no more than about five-eighths of the thickness; no more than about three-fifths of the thickness; no more than about four-sevenths of the thickness; or no more than about five-ninths of the thickness.

The maximum dopant concentration may also be located no more than a specified distance apart from the midpoint along the thickness. As one example, the maximum dopant concentration may be located no more than about 250 µm apart from the midpoint along the thickness. The maximum dopant concentration may, in some embodiments, be located no more than about 200 µm apart from the midpoint along the thickness; no more than about 100 µm apart from the midpoint along the thickness; no more than about 50 µm apart from the midpoint along the thickness; no more than about 25 µm apart from the midpoint along the thickness; or no more than about 10 µm apart from the midpoint along the thickness. In some embodiments, the maximum dopant concentration may, in some embodiments, be located no more than about three-eighths of the thickness apart from the midpoint along the thickness; no more than about one-quarter of the thickness apart from the midpoint along the thickness; no more than about one-fifth of the thickness apart from the midpoint along the thickness; no more than about one-eighth of the thickness apart from the midpoint along the thickness; or no more than about one-tenth of the thickness apart from the midpoint along the thickness. In some embodiments, the maximum dopant concentration is located at or near the center of the yttrium aluminum garnet region.

The maximum dopant concentration may, in some embodiments, be located no more than a specified distance apart from the first or second surface. The maximum dopant concentration may, in some embodiments, be located no more than about 200 µm apart from the first or second surface; no more than about 100 µm apart from the first or second surface; no more than about 50 µm apart from the first or second surface; no more than about 25 µm apart from first or second surface; or no more than about 10 µm apart from the first or second surface. In some embodiments, the maximum dopant concentration is located at or near the first or second surface.

First Half-Maximum Dopant Concentration

The dopant concentration gradient may also include a first half-maximum dopant concentration. The half-maximum dopant concentration refers to a dopant concentration that is half of the maximum dopant concentration for a particular emissive ceramic. For example, in one embodiment, the dopant concentration gradient may have a maximum dopant concentration of about 0.5 at % and a half-maximum dopant concentration of about 0.25 at %.

The first half-maximum dopant concentration may, in some embodiments, be at a certain distance apart from the first and second surfaces along the thickness. The first half-maximum dopant concentration may, for example, be located at least 10 µm apart from the first and second surfaces; at least about 25 µm apart from the first and second surfaces; at least about 50 µm apart from the first and second surfaces; at least about 100 µm apart from the first and second surfaces; at least about 200 µm apart from the first and second surfaces; or at least about 250 µm apart from the first and second surfaces. The first half-maximum dopant concentration may, for example, be located at least one-tenth of the thickness apart from the first and second surfaces; at least about one-eighth of the thickness apart from the first and second surfaces; at least about one-fifth of the thickness apart from the first and second surfaces; at least about one-quarter of the thickness apart from the first and second surfaces; or at least about three-eighths of the thickness apart from the first and second surfaces.

The first half-maximum dopant concentration can also be at a certain distance apart from the maximum dopant concentration. The first half-maximum dopant concentration may, for example, be at least 10 µm apart from the maximum dopant concentration; at least about 25 µm apart from the maximum dopant concentration; at least about 50 µm apart from the maximum dopant concentration; at least about 100 µm apart from the maximum dopant concentration; at least about 200 µm apart from the maximum dopant concentration; or at least about 250 µm apart from the maximum dopant concentration. The first half-maximum dopant concentration may, for example, be located at least one-tenth of the thickness apart from the maximum dopant concentration; at least about one-eighth of the thickness apart from the maximum dopant concentration; at least about one-fifth of the thickness apart from the maximum dopant concentration; at least about one-quarter of the thickness apart from the maximum dopant concentration; or at least about three-eighths of the thickness apart from the maximum dopant concentration.

In some embodiments, the dopant concentration gradient includes a first slope at or near the first half-maximum dopant concentration. The absolute value of the first slope may, for example, be in range of about one-eighth of the maximum dopant concentration divided by the thickness (i.e., $C_{max}$ divided by 8L) and about two times the maximum dopant concentration divided by the thickness. As an example, if the maximum dopant concentration is about 0.2 at % and the thickness is about 100 µm, then the absolute value of the first slope would be in the range of about 0.00025 at %/µm and about 0.004 at %/µm.

The absolute value of the first slope may, for example, be at least about one-quarter of the maximum dopant concentration divided by the thickness; at least about three-eighths of the maximum dopant concentration divided by the thickness; at least about one-half of the maximum dopant concentration divided by the thickness; at least about three-quarters of the maximum dopant concentration divided by the thickness; or at least about the maximum dopant concentration divided by the thickness.

The absolute value of the first slope may, for example, be no more than about the maximum dopant concentration divided by the thickness; no more than about three-quarters of the maximum dopant concentration divided by the thickness; no more than about one-half of the maximum dopant concentration divided by the thickness; or no more than about three-eighths of the maximum dopant concentration divided by the thickness.

The absolute value of the first slope may also be within a certain numerical range. For example, the absolute value of the first slope may be in the range of about 0.001 at %/µm and about 0.004 at %/µm. The absolute value of the first slope may, in some embodiments, be at least about 0.0001 at %/µm; at least about 0.0005 at %/µm; at least about 0.001 at %/µm; at least about 0.0015 at %/µm; or at least about 0.002 at %/µm. The absolute value of the first slope may, in some embodiments, no more than about 0.006 at %/µm; no more than about 0.005 at %/µm; no more than about 0.004 at %/µm; or no more than about 0.003 at %/µm.

Second Half-Maximum Dopant Concentration

The dopant concentration gradient may also include a second half-maximum dopant concentration. The second half-maximum dopant concentration may, in some embodiments, be located at a certain distance apart from the first and second surfaces along the thickness. The second half-maximum dopant concentration may, for example, be located at least 10 µm apart from the first and second surfaces; at least about 25 µm apart from the first and second surfaces; at least about 50 µm apart from the first and second surfaces; at least about 100 µm apart from the first and second surfaces; at least about 200 µm apart from the first and second surfaces; or at least about 250 µm apart from the first and second surfaces. The second half-maximum dopant concentration may, for example, be located at least one-tenth of the thickness apart from the first and second surfaces; at least about one-eighth of the thickness apart from the first and second surfaces; at least about one-fifth of the thickness apart from the first and second surfaces; at least about one-quarter of the thickness apart from the first and second surfaces; or at least about three-eighths of the thickness apart from the first and second surfaces.

The second half-maximum dopant concentration may, for example, be located at least 10 µm apart from the maximum dopant concentration; at least about 25 µm apart from the maximum dopant concentration; at least about 50 µm apart from the maximum dopant concentration; at least about 100 µm apart from the maximum dopant concentration; at least about 200 µm apart from the maximum dopant concentration; or at least about 250 µm apart from the maximum dopant concentration. The second half-maximum dopant concentration may, for example, be located at least one-tenth of the thickness apart from the maximum dopant concentration; at least about one-eighth of the thickness apart from the maximum dopant concentration; at least about one-fifth of the thickness apart from the maximum dopant concentration; at least about one-quarter of the thickness apart from the maximum dopant concentration; or at least about three-eighths of the thickness apart from the maximum dopant concentration.

In some embodiments, the second half-maximum dopant concentration is located at least a specified distance apart from the first half-maximum dopant concentration along the thickness. The second half-maximum dopant concentration may, for example, be located at least 10 µm apart from the first half-maximum dopant concentration; at least about 25 µm apart from the first half-maximum dopant concentration; at least about 50 µm apart from the first half-maximum dopant concentration; at least about 100 µm apart from the first half-maximum dopant concentration; at least about 200 µm apart from the first half-maximum dopant concentration; or at least about 250 µm apart from the first half-maximum dopant concentration. The second half-maximum dopant concentration may, for example, be located at least one-tenth of the thickness apart from the first half-maximum dopant concentration; at least about one-eighth of the thickness apart from the first half-maximum dopant concentration; at least about one-fifth of the thickness apart from the first half-maximum dopant concentration; at least about one-quarter of the thickness apart from the first half-maximum dopant concentration; or at least about three-eighths of the thickness apart from the first half-maximum dopant concentration.

In some embodiments, the dopant concentration gradient includes a second slope at or near the second half-maximum dopant concentration. The absolute value of the second slope may, for example, be in range of about one-eighth of the maximum dopant concentration divided by the thickness (i.e., $C_{max}$ divided by 8L) and about two times the maximum dopant concentration divided by the thickness. As an example, if the maximum dopant concentration is about 0.2 at % and the thickness is about 100 µm, then the absolute value of the second slope would be in the range of about 0.00025 at %/µm and about 0.004 at %/µm.

The absolute value of the second slope may, for example, be at least about one-quarter of the maximum dopant concentration divided by the thickness; at least about three-eighths of the maximum dopant concentration divided by the thickness; at least about one-half of the maximum dopant concentration divided by the thickness; at least about three-quarters of the maximum dopant concentration divided by the thickness; or at least about the maximum dopant concentration divided by the thickness.

The absolute value of the second slope may, for example, be no more than about the maximum dopant concentration divided by the thickness; no more than about three-quarters of the maximum dopant concentration divided by the thickness; no more than about one-half of the maximum dopant concentration divided by the thickness; or no more than about three-eighths of the maximum dopant concentration divided by the thickness.

The absolute value of the second slope may also be within a certain numerical range. For example, the absolute value of the second slope may be in the range about 0.001 at %/µm and about 0.004 at %/µm. The absolute value of the second slope may, in some embodiments, be at least about 0.0001 at %/µm; at least about 0.0002 at %/µm; at least about 0.0005 at %/µm; at least about 0.001 at %/µm; or at least about 0.002 at %/µm. The absolute value of the second slope may, in some embodiments, be no more than about 0.01 at %/µm; no more than about 0.008 at %/µm; no more than about 0.004 at %/µm; no more than about 0.002 at %/µm; or no more than about 0.001 at %/µm.

In some embodiments, the absolute value of the first slope is about the same as the absolute value of the second slope.

Time-Of-Flight Secondary Ion Mass Spectroscopy can be used, for example, to determine the dopant concentration, thickness or distances/locations of the respective points of interest, and the resultant slopes at the respective points of interest.

Other Characteristics

The thickness of the yttrium aluminum garnet region is not particularly limited. In some embodiments, the thickness of the yttrium aluminum garnet region is in the range of about 100 µm to about 1 mm. The thickness of the yttrium aluminum garnet region may, for example, be at least about 100 µm; at least about 150 µm; at least about 200 µm; at least about 250 µm; at least about 400 µm; or at least about 500 µm. The thickness of the yttrium aluminum garnet region may, for example, be no more than about 1 mm; no more than about 900 µm; no more than about 800 µm; no more than about 750 µm; no more than about 600 µm; or no more than about 500 µm.

Some embodiments of the dopant concentration gradient are generally symmetric about a point at or near the center of the yttrium aluminum garnet regions (e.g., as depicted in FIG. 4). Some embodiments of the dopant concentration gradient are generally asymmetric about a point at or near the center of the yttrium aluminum garnet regions (e.g., as depicted in FIG. 3). Other embodiments can be asymmetric about a point that is apart from the center of the yttrium aluminum garnet regions, e.g., with $C_{max}$ between 0 to ½L, such as ¼L, or in another embodiment with $C_{max}$ between ½L to L, such as ¾L (not shown).

The dopant concentration gradient, in some embodiments, may include a non-zero dopant concentration along substantially all of the thickness. That is, the dopant concentration is greater than zero along substantially all of the thickness. In some embodiments, the dopant concentration gradient may include dopant concentrations that are effective to produce luminescence along substantially all of the thickness.

The dopant concentration gradient may include a peak having a specified full-width at half-maximum. For example, the full-width at half-maximum may be in the range of about 50 µm to about 500 µm. The full-width at half-maximum may, for example, be at least about 50 µm; at least about 75 µm; at least about 100 µm, at least about 150 µm; or at least about 200 µm. The full-width at half-maximum may, for example, be no more than about 500 µm; no more than about 400 µm; no more than about 300 µm; no more than about 250 µm; no more than about 200 µm; or no more than about 150 µm. In some embodiments, the full-width at half-maximum may be at least about one-tenth of the thickness of the YAG region; at least about one-quarter of the thickness of the YAG region; at least about one-eighth of the thickness of the YAG region; at least about one-quarter of the thickness of the YAG region; or at least about three-eighths of the thickness of the YAG region. In some embodiments, the full-width at half-maximum may be no more than about five-eighths of the thickness of the YAG region; no more than about one-half of the thickness of the YAG region; no more than about three-eighths of the thickness of the YAG region; or no more than about one-quarter of the thickness of the YAG region. In some embodiments, the dopant concentration gradient consists essentially of a single peak.

Furthermore, the dopant concentration gradient may be characterized by the average dopant concentration along the entire thickness. The average dopant concentration may, for example, be in the range of about 0.1 at % to about 0.5 at %. In some embodiments, the average dopant concentration may be at least about 0.05 at %; at least about 0.1 at %; at least about 0.2 at %; or at least about 0.25 at %. In some embodiments, the average dopant concentration may be no more than about 1 at %; no more than about 0.5 at %; no more than about 0.4 at %; no more than about 0.3 at %; or no more than about 0.25 at %. The ratio of the maximum dopant concentration to the average dopant concentration may be, for example, in the range of about 5:1 to about 1.5:1; in the range of about 4:1 to about 1.5:1; or in the range of about 3:1 to about 2:1.

Non-limiting examples of dopants that may be incorporated into the yttrium aluminum garnet region to form the dopant concentration gradient include Nd, Er, Eu, Cr, Yb, Sm, Tb, Ce, Pr, By, Ho, Gd, Lu, and combinations thereof. In some embodiments, the dopant is Ce. As an example, the doped yttrium aluminum garnet region may be represented by the formula $(Y_{1-x}Ce_x)_3Al_5O_{12}$.

As disclosed above, one advantage of the emissive ceramics disclosed herein exhibit superior internal quantum efficiencies. In some embodiments, the emissive ceramic exhibits an internal quantum efficiency (IQE) of at least about 0.80 when exposed to radiation having a wavelength of about 455 nm. In some embodiments, the emissive ceramic exhibits an internal quantum efficiency (IQE) of at least about 0.85 when exposed to radiation having a wavelength of about 455 nm. In some embodiments, the emissive ceramic exhibits an internal quantum efficiency (IQE) of at least about 0.90 when exposed to radiation having a wavelength of about 455 nm.

Porous Regions

The emissive ceramics may optionally include one or more porous regions (e.g., zero, one, two, three, or more porous regions). Without being bound to any particular theory, it is believed that adding porous layers reduces the angular dependence of the light emission properties for the emissive ceramic. In other words, the porous regions may reduce any anisotropy in the light emission properties of the emissive ceramic.

The location and size of the one or more porous regions within the YAG region is not particularly limited. In some embodiments, the YAG region includes at least a first porous region and a first non-porous porous region. In some embodiments, the YAG region includes a first porous region, a first non-porous region, and a second non-porous region. In some embodiments, the YAG region includes a first porous region, a second porous region, and a first non-porous region.

Figure 25A:
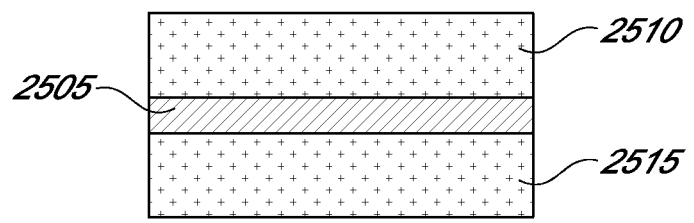
FIGS. 25A-C illustrate non-limiting examples of emissive ceramics having one or more porous regions.

FIG. 25A is one example of an emissive ceramic including a porous region. Porous layer 2505 is interposed between first non-porous layer 2510 and second non-porous layer 2515. Each of porous layer 2505, first non-porous layer 2510, and second non-porous layer 2515 may include a YAG host material (i.e., the components together form the YAG region of the emissive ceramic). As depicted in FIG. 25A, the porous region may be located at or near the center of the emissive ceramic.

In some embodiments, the emissive ceramic may include a first porous region and a second porous region, wherein the first porous region and the second porous region have different pore volume percentages. In some embodiments, the emissive ceramic may include a first porous region and a second porous region, wherein the first porous region and the second porous region have different average pore sizes.

Figure 25B:
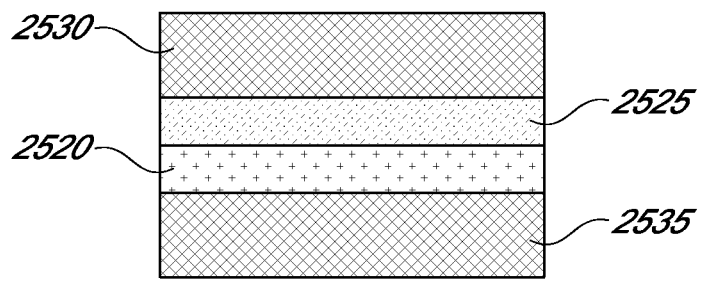

FIG. 25B is one example of an emissive ceramic including a plurality of porous layers with different pore volumes. The emissive ceramic includes first porous layer 2520 which has a lower porosity (e.g., lower average pore sizes and/or lower pore volume percentage) than second porous layer 2525. Both first porous layer 2520 and second porous layer 2525 are disposed between first non-porous layer 2530 and second non-porous layer 2535. Each of first porous layer 2520, second porous layer 2525, first non-porous layer 2530, and second non-porous layer 2535 may include a YAG host material (i.e., the components together form the YAG region of the emissive ceramic).

Figure 25C:
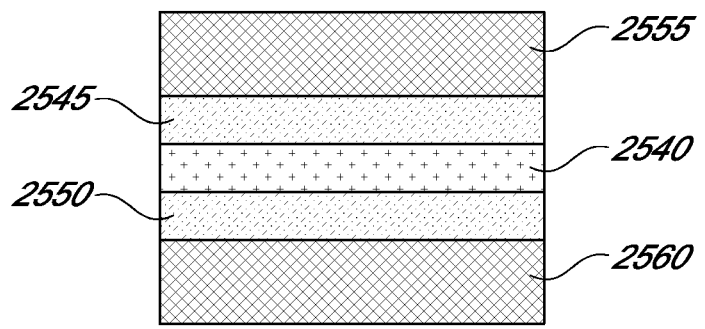

FIG. 25C is another example of an emissive ceramic including a plurality of porous layers with different pore volumes. The emissive ceramic includes first porous layer 2540 disposed between second porous layer 2545 and third porous layer 2550. First porous layer 2540 can have a different porosity (e.g., lower average pore sizes and/or lower pore volume percentage) than both second porous layer 2545 and third porous layer 2550. In some embodiments, both second porous layer 2545 and third porous layer 2550 have the same porosity. In some embodiments, second porous layer 2545 and third porous layer 2550 have different porosity. Second porous layer 2545 and third porous layer 2550 may be disposed between first non-porous layer 2555 and second non-porous layer 2560. Each of first porous layer 2540, second porous layer 2545, third porous layer 2550, first non-porous layer 2555, and second non-porous layer 2560 may include a YAG host material (i.e., the components together form the YAG region of the emissive ceramic).

In some embodiments, substantially all of the YAG region in the emissive ceramic is porous. That is, the YAG region is porous throughout. In some embodiments, the YAG region has a uniform porosity along its thickness. In some embodiments, the porosity of the YAG region changes along it thickness.

The size of the pores in the one or more porous regions is not particularly limited. The average pore size in the one or more porous regions can be, for example, at least about 0.5 $\mu$m; at least about 1 $\mu$m; at least about 2 $\mu$m; at least about 4 $\mu$m; or at least about 7 $\mu$m. The average pore size in the porous region can be, for example, no more than about 50 $\mu$m; no more than about 25 $\mu$m; no more than about 10 $\mu$m; or no more than about 7 $\mu$m. In some embodiments, the average size of the pores in the one or more porous regions can be in the range of about 0.5 $\mu$m to about 50 $\mu$m. For example, the average pore size can be about 4 $\mu$m. As noted about, the emissive ceramic may include two or more porous regions, each having different average pore sizes.

The volume percentage of the pores in the one or more porous regions may also vary. The volume percentage of the pores in the one or more porous regions can be, for example, at least about 0.5%; at least about 1%; at least about 2%; at least about 4%; at least about 10; or at least about 20%. The volume percentage of the pore in the one or more porous regions can be, for example, no more than about 80%; no more than about 50%; no more than about 30%; no more than about 20%; no more than about 10%; or no more than about 8%. In some embodiments, the volume percentage of the pore in the one or more porous regions can be in the range of about 0.5% to about 80%. For example, the volume percentage of the pore in the one or more porous regions can be about 6%. As noted about, the emissive ceramic may include two or more porous regions, each having different pore volume percentages.

As noted above, the one or more porous regions can be layer(s) in the emissive ceramic (e.g., porous layer 2505 depicted in FIG. 25A). The thickness of the one or more porous layers can vary. The one or more porous layers (e.g., one, two, three, or more porous layers) may each independently have a thickness in the range of about 10 $\mu$m to about 800 $\mu$m. In some embodiments, the one or more porous layers may each independently have a thickness in the range of about 20 $\mu$m to about 400 $\mu$m. The one or more porous layers may, for example, each independently have a thickness that is at least about 10 $\mu$m; at least about 40 $\mu$m; at least about 80 $\mu$m; at least about 100 $\mu$m; or at least about 200 $\mu$m. The one or more porous layers may, for example, each independently have a thickness that is no more than about 400 $\mu$m; no more than about 300 $\mu$m; no more than about 250 $\mu$m; no more than about 200 $\mu$m; no more than about 150 $\mu$m; no more than about 100 $\mu$m; or no more than about 80 $\mu$m. In some embodiments, the thickness at least one porous layer (e.g., one or two porous layers) may be less than or equal to the thickness of at least one non-porous layer. In some embodiments, the thickness at least one porous layer (e.g., one or two porous layers) is greater than or equal to the thickness of at least one non-porous layer.

As will described further below, the one or more porous layers can be prepared, for example, by sintering an assembly that includes organic particles dispersed in at least a portion of the assembly. The organic particle may be volatilized, for example, during debindering or sintering to yield pores within regions of the emissive ceramic. Unlike dopant, the organic particles exhibit minimal (if any) diffusion when heated; therefore, the location of the porous regions correlates to the layers in the assembly having the organic particles. Accordingly, the pore size, the pore volume percentage, and location of the porous regions may be controlled by the organic particle size, amount of organic particles, and distribution of organic particles in the assembly. The arrangement of the porous and non-porous layers (if any) can therefore be readily varied by changing the configuration of the assembly used to prepare the emissive ceramic. Moreover, as discussed above, the dopant concentrations in the layers of the assembly can similarly be varied to obtain the desired dopant and porosity distributions.

The non-porous regions can be substantially free of pores. The volume percentage of pores in the non-porous region can be, for example, no more than about 0.05%; no more than about 0.01%; or no more than about 0.001%.

As noted above, the one or more non-porous regions can be layer(s) in the emissive ceramic (e.g., first non-porous layer 2510 depicted in FIG. 25A). The thickness of the one or more non-porous layers can vary. The one or more non-porous layers (e.g., one, two, three, or more non-porous layers) may each independently have a thickness in the range of about 10 μm to about 800 μm. In some embodiments, the one or more non-porous layers may each independently have a thickness in the range of about 20 μm to about 400 μm. The one or more non-porous layers may, for example, each independently have a thickness that is at least about 10 μm; at least about 40 μm; at least about 80 μm; at least about 100 μm; or at least about 200 μm. The one or more non porous layers may, for example, each independently have a thickness that is no more than about 400 μm; no more than about 300 μm; no more than about 250 μm; no more than about 200 μm; no more than about 150 μm; no more than about 100 μm; or no more than about 80 μm.

The located of the one or more porous regions in the emissive ceramic may optionally have a symmetric configuration in the emissive ceramic. For example, FIG. 25A depicts a symmetric emissive ceramic provided that (i) the thickness of first non-porous layer 2510 is about the same as the thickness of second non-porous layer 2515 and (ii) the porosity is generally uniform in porous layer 2505. In some embodiments, the one or more porous regions in the emissive ceramic may have an asymmetric configuration in the emissive ceramic. For example, FIG. 25B depicts an asymmetric emissive ceramic at least because first porous layer 2520 and second porous layer 2525 have different porosities.

At least one porous region may also be located no more than a specified distance apart from the midpoint along the thickness. As one example, at least one porous region may be located no more than about 250 μm apart from the midpoint along the thickness. At least one porous region may, in some embodiments, be located no more than about 200 μm apart from the midpoint along the thickness; no more than about 100 μm apart from the midpoint along the thickness; no more than about 50 μm apart from the midpoint along the thickness; no more than about 25 μm apart from the midpoint along the thickness; or no more than about 10 μm apart from the midpoint along the thickness. In some embodiments, at least one porous region may be located no more than about three-eighths of the thickness apart from the midpoint along the thickness; no more than about one-quarter of the thickness apart from the midpoint along the thickness; no more than about one-fifth of the thickness apart from the midpoint along the thickness; no more than about one-eighth of the thickness apart from the midpoint along the thickness; or no more than about one-tenth of the thickness apart from the midpoint along the thickness. In some embodiments, at least one porous region is located at or near the center of the yttrium aluminum garnet region.

At least one porous layer may, in some embodiments, be located no more than a specified distance apart from the first or second surface. At least one porous region may, in some embodiments, be located no more than about 200 μm apart from the first or second surface; no more than about 100 μm apart from the first or second surface; no more than about 50 μm apart from the first or second surface; no more than about 25 μm apart from first or second surface; or no more than about 10 μm apart from the first or second surface. In some embodiments, at least one porous region is located at or near the first or second surface. In some embodiments, a first porous region is located at or near the first surface and a second porous region is located at or near the second surface.

In some embodiments, at least one non-porous region is located at or near the first or second surface. In some embodiments, a first non-porous region is located at or near the first surface and a second non-porous region is located at or near the second surface.

In some embodiments, the maximum dopant concentration is located in a porous layer. In some embodiments, the maximum dopant concentration is located in a non-porous layer. In some embodiments, the first half-maximum dopant concentration is located in a non-porous layer. In some embodiments, the first half-maximum dopant concentration is located in a porous layer. In some embodiments, the second half-maximum dopant concentration is located in a non-porous layer. In some embodiments, the second half-maximum dopant concentration is located in a porous layer. In some embodiments, the maximum dopant concentration is located in a porous layer, the first half-maximum dopant concentration is located in a first non-porous layer, and the second half-maximum dopant concentration is located in a second non-porous layer. In some embodiments, the maximum dopant concentration is located in a first porous layer, the first half-maximum dopant concentration is located in a second porous layer, and the second half-maximum dopant concentration is located in a third porous layer. In some embodiments, the maximum dopant concentration is located in a first porous layer, the first half-maximum dopant concentration is located in a second porous layer, and the second half-maximum dopant concentration is located in a first non-porous layer.

Methods of Making Emissive Ceramics

Some embodiments disclosed herein include methods of forming emissive ceramics, such as any of the emissive ceramics disclosed above. The method may include sintering an assembly, where the assembly includes a doped layer disposed on one side of a non-doped layer.

Figures 5A, 5B:
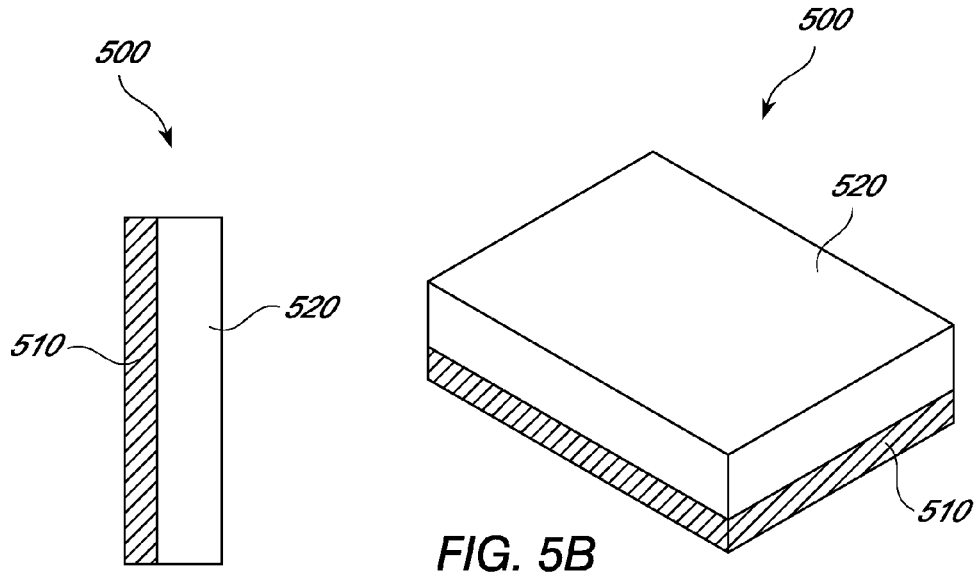
FIGS. 5A-B illustrate one embodiment of an assembly that may be sintered according to the methods disclosed herein.

FIGS. 5A and 5B illustrate one embodiment of an assembly that may be sintered according to the methods disclosed herein. FIG. 5A is a side view of assembly 500 having doped layer 510 disposed on one side of non-doped layer 520. FIG. 5B shows a perspective view of assembly 500. Assembly 500 may, for example, be configured and sintered under appropriate conditions to obtain a dopant concentration gradient similar to the one depicted in FIG. 3.

Figures 6A, 6B:
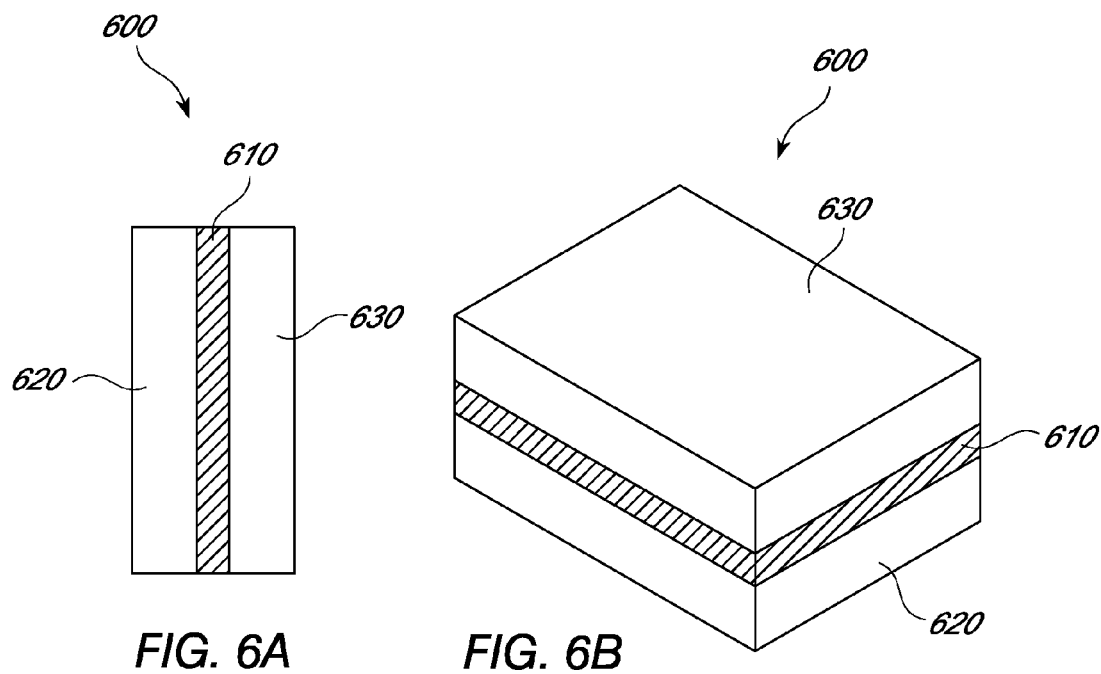
FIGS. 6A-B illustrate another embodiment of an assembly that may be sintered according to the methods disclosed herein.

FIGS. 6A and 6B illustrate another embodiment of an assembly that may be sintered according to the methods disclosed herein. FIG. 6A is a side view of assembly 600 having doped layer 610 interposed between first non-doped layer 620 and second non-doped layer 630. FIG. 6B shows a perspective view of assembly 600. Assembly 600 may, for example, be configured and sintered under appropriate conditions to obtain a dopant concentration gradient similar to the one depicted in FIG. 4.

The doped layer of the assembly can include a yttrium aluminum garnet, yttrium aluminum garnet precursor, or a combination thereof. A yttrium aluminum garnet precursor can be any components that will form yttrium aluminum garnet during the process. As an example, a yttrium aluminum garnet precursor may be a mixture of $Y_2O_3$ and $Al_2O_3$ at the stoichiometric ratio of 3:5 that forms yttrium aluminum garnet during sintering. In some embodiments, the doped layer includes at least 50% yttrium aluminum garnet and/or its equivalent amount of precursor. In some embodiments, the doped layer includes at least 80% yttrium aluminum garnet and/or its equivalent amount of precursor. In some embodiments, the doped layer includes at least 90% yttrium aluminum garnet and/or its equivalent amount of precursor. In some embodiments, the doped layer consists essentially of yttrium aluminum garnet and the desired dopant.

The doped layer also includes a dopant, such as Nd, Er, Eu, Cr, Yb, Sm, Tb, Ce, Pr, Gd, Dy, Ho, Lu and combinations thereof. In some embodiments, the dopant is Ce. The amount of dopant in the doped layer can be an amount effective to impart luminescence upon the emissive ceramic after sintering is complete. Moreover, Applicants have found that the initial concentration of dopant in the doped layer may affect the internal quantum efficiency of the emissive ceramic. Thus, in some embodiments, the doped layer includes about 0.1 at % to about 5 at % dopant. The doped layer may, for example, include at least about 0.5 at %; at least about 1 at %; at least about 1.5 at %; or at least about 2 at % of the dopant. The doped layer may, for example, include no more than about 4.5 at %; no more than about 4 at %; no more than about 3.5 at %; or no more than about 3 at % of the dopant. In some embodiments, the doped layer contains a generally uniform distribution of dopant.

The one or more non-doped layers in the assembly (e.g., the assembly that can be sintered to form the emissive ceramic) can also include a yttrium aluminum garnet, yttrium aluminum garnet precursor, or a combination thereof. In some embodiments, the one or more non-doped layers include at least 50% yttrium aluminum garnet and/or its precursor. In some embodiments, the one or more non-doped layers include at least 80% yttrium aluminum garnet and/or its equivalent amount of precursor. In some embodiments, the one or more non-doped layers include at least 90% yttrium aluminum garnet and/or its equivalent amount of precursor. In some embodiments, the one or more non-doped layers consists essentially of yttrium aluminum garnet and/or its equivalent amount of precursor. However, the one or more non-doped layers can be substantially free of dopant. In some embodiments, the one or more non-doped layers can include an amount of dopant that is ineffective for imparting luminescence upon the emissive ceramic. In some embodiments, the one or more non-doped layers can include less than about 0.05 at % dopant. In some embodiments, the one or more non-doped layers can include less than about 0.01 at % dopant. In some embodiments, the one or more non-doped layers can include less than about 0.001 at % dopant.

In some embodiments, the relative thickness of the doped layer and one or more non-doped layers may affect the internal quantum efficiencies. For example, in the case of a thinner emissive layer, dopant within the doped layer can diffuse into the neighboring non-doped layers, which reduces the maximum dopant concentration. Without being bound to any particular theory, it is believed the lower dopant concentration reduces quenching and therefore increases internal quantum efficiencies. In contrast, a thicker emissive layer may not exhibit a similar reduction in the maximum dopant concentration because dopant is unable to diffuse across the thicker doped layer. This in turn may result in higher maximum dopant concentrations that can increase quenching Accordingly, in some embodiments, the doped layer has a thickness configured to enable a reduction of the initial dopant concentration within the doped layer. In some embodiments, the doped layer has a thickness configured to enable diffusion from the doped layer and into the non-emissive layer(s) during sintering. In some embodiments, the doped layer has a thickness in the range of about 10 µm to about 200 µm. In some embodiments, the doped layer has a thickness in the range of about 40 µm to about 80 µm. The doped layer may, for example, have a thickness that is at least about 20 at least about 30 µm; at least about 40 µm; or at least about 50 µm. The doped layer may also, for example, have a thickness that is no more than about 150 µm; no more than about 120 µm; no more than about 100 µm; no more than about 80 µm; or no more than about 70 µm.

The one or more non-doped layers (e.g., one or two non-doped layers) may each independently have a thickness in the range of about 40 µm to about 800 µm. In some embodiments, the one or more non-doped layers may each independently have a thickness in the range of about 40 µm to about 400 µm. The one or more non-doped layers may, for example, each independently have a thickness that is at least about 40 µm; at least about 80 µm; at least about 100 µm; or at least about 200 µm. The one or more non-doped layers may, for example, each independently have a thickness that is no more than about 400 µm; no more than about 300 µm; no more than about 250 µm; no more than about 200 µm; no more than about 150 µm. In some embodiments, at least one non-doped layer (e.g., one or two non-doped layers) may be less than or equal to the thickness of the doped layer. In some embodiments, at least one non-doped layer (e.g., one or two non-doped layers) is greater than or equal to the thickness of the doped layer.

The assembly may, for example, consist essentially of a doped layer and a non-doped layer. In other words, the assembly includes a doped layer and non-doped layer, but excludes any other layers that form a yttrium aluminum garnet region (e.g., assembly 500 in FIGS. 5A and 5B). The thickness of the non-doped layer may, for example, be greater than the thickness of doped layer. The ratio of the thickness of the non-doped layer relative to the thickness of the doped layer may, in some embodiments, be in the range of about 20:1 to about 1.5:1. The ratio of the thickness of the non-doped layer relative to the thickness of the doped layer may, for example, be no more than about 15:1; no more than about 12:1; no more than about 10:1; no more than about 8:1; or no more than about 5:1. The ratio of the thickness of the non-doped layer relative to the thickness of the doped layer may also, for example, be at least about 2:1; at least about 3:1; at least about 4:1; or at least about 5:1.

The assembly may also include, or consist essentially of, a doped layer and two non-doped layers (e.g., assembly 600 in FIGS. 6A and 6B). The assembly may therefore have a first non-doped layer and a second non-doped layer. The first and second non-doped layers can each independently have any thickness, such as those disclosed above. For example, the first non-doped layer may have a thickness in the range of about 40 µm to about 400 µm, and the second non-doped layer may have a thickness in the range of about 40 µm to about 400 µm. In some embodiments, the first non-doped layer is thicker than the doped layer. In some embodiments, the second non-doped layer is thicker than the doped layer. In some embodiments, both the first and second non-doped layers are thicker than the doped layer. In some embodiments, the first and second non-doped layers have different thicknesses. In some embodiments, the first and second non-doped layers have thicknesses that are about the same.

The ratio of either the first non-doped layer or the second non-doped layer relative to the dope layer may each independently be within the ranges discussed above. For example, the ratio of the thickness of the first non-doped layer relative to the thickness of the doped layer can be in the range of about 20:1 to about 1.5:1. Also, the ratio of the thickness of the second non-doped layer relative to the thickness of the doped layer can be in the range of about 20:1 to about 1.5:1.

One or more layers in the assembly may optionally include organic particles. These organic particles can be volatilized to form one or more porous regions in the final emissive ceramic. In some embodiment, the organic particles can include a polymer. For example, the organic particles can be crosslinked polymethylmethacrylate (PMMA) beads, polystyrene bead, and polyethylene bead. In some embodiments, at least one doped layer in the assembly includes organic particles. In some embodiments, at least one non-doped layer in the assembly includes organic particles. In some embodiments, substantially all of the assembly includes organic particles. In some embodiments, at least one layer in the assembly is substantially free of organic particles.

The size of organic particles can be selected based on the desired pore size for the porous region in the final emissive ceramic. The average largest dimension of the organic particles can be, for example, at least about 0.5 µm; at least about 1 µm; at least about 2 µm; at least about 4 µm; or at least about 7 µm. The average largest dimension of the organic particles can be, for example, no more than about 50 µm; no more than about 25 µm; no more than about 10 µm; or no more than about 7 µm. In some embodiments, the average largest dimension of the organic particles can be in the range of about 0.5 µm to about 50 µm. For example, the average largest dimension of the organic particles can be about 4 µm. The assembly may, in some embodiments, include two or more layers having organic particles, where the average largest dimension of the organic particles in the at least two layers in different. For example, the assembly may include a doped layer having organic particles with an average largest dimension of about 1 µm and a non-doped layering having organic particles with an average largest dimension of about 4 µm.

The organic particles may, in some embodiments, be generally spherical (e.g., beads). In some embodiments, the organic particles may have an aspect ratio less than about 10; less than about 5; or less than about 2. In some embodiments, the organic particles have an aspect ratio of about 1.

The amount of organic particles in each of the layers may be varied depending on the desired pore volume percentage. The amount of organic particles necessary to obtain a desired pore volume percentage will vary depending on various factors, such as the size and density of the organic particles. The skilled artisan, guided by the teachings of the present application, can readily determine this amount. In some embodiments, the amount of organic particles in at least one layer in the assembly is configured to produce a final emissive ceramic having a porous region with a pore volume percentage in the range of about 0.5% to about 80%. In some embodiments, the amount of organic particles in at least one layer in the assembly is configured to produce a final emissive ceramic having a porous region with a pore volume percentage in the range of about 1% to about 30%

Forming the Assembly

Figure 7:
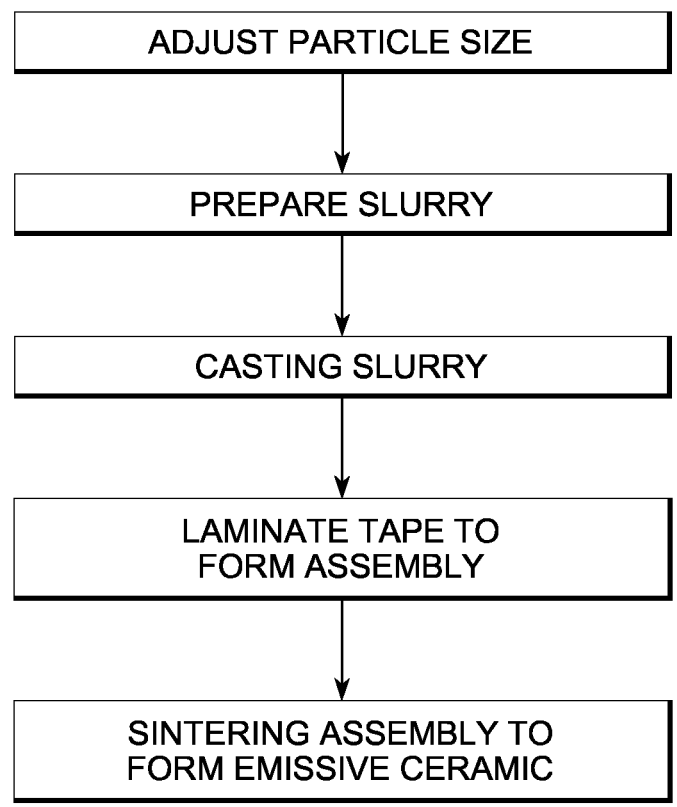
FIG. 7 shows a preparation flow diagram for one embodiment of forming the emissive ceramic that includes lamination.

The assembly may be formed by laminating two or more cast tapes, where the cast tapes can include yttrium aluminum garnet. At least one of the cast tapes will also include a dopant to form the doped layer. Examples and methods of laminating and sintering two or more cast tapes are disclosed in U.S. Pat. No. 7,514,721 and U.S. Publication No. 2009/0108507, both of which are hereby incorporated by reference in their entirety. FIG. 7 shows a preparation flow diagram for one embodiment of forming the emissive ceramic that includes lamination.

First, the particle size of the raw materials (e.g., nitrate or oxide based raw materials, such as $Y_2O_3$ and $Al_2O_3$ for forming YAG) may optionally be adjusted to reduce cracking in the cast tapes from capillary forces during evaporation of solvents. For example, the particle size can be adjusted by pre-annealing raw material particles to obtain the desired particle size. Raw material particles can be pre-annealed in the temperature range of about 800° C. to about 1800° C. (or more preferably 1000° C. to about 1500° C.) to obtain the desired particle size. The pre-annealing may occur in a vacuum, air, $O_2$, $H_2$, $H_2/N_2$, or a noble gas (e.g., He, Ar, Kr, Xe, Rn, or combinations thereof). In an embodiment, each of the raw materials (e.g., $Y_2O_3$ and $Al_2O_3$ for forming YAG) is adjusted to be about the same particle size. In another embodiment, the particles have a BET surface area in the range of about 0.5 $m^2/g$ to about 20 $m^2/g$ (preferably about 1.0 $m^2/g$ to about 10 $m^2/g$, or more preferably about 3.0 $m^2/g$ to about 6.0 $m^2/g$).

A slurry may then be prepared for subsequently casting into a tape. Pre-made phosphors (e.g., phosphors prepared by flow-based thermochemical synthetic routes described herein) and/or stoichiometric amounts of raw materials can be intermixed with various components to form a mixture. Exemplary components for the mixture include, but are not limited to, dopants, dispersants, plasticizers, binders, sintering aids and solvents.

In some embodiments, small quantities of flux materials (e.g., sintering aids) may be used in order to improve sintering properties of the assembly if desired. In some embodiments, the sintering aids may include, but are not limited to, tetraethyl orthosilicate (TEOS), colloidal silica, lithium oxide, titanium oxide, zirconium oxide, magnesium oxide, barium oxide, calcium oxide, strontium oxide, boron oxide, or calcium fluoride. Additional sintering aids include, but are not limited to, alkali metal halides such as NaCl or KCl, and organic compounds such as urea. In some embodiments, the assembly comprises between about 0.01% and about 5%, between about 0.05% and about 5%, between about 0.1% and about 4%, or between about 0.3% and about 1% by weight of the flux material(s) or sintering aid(s). The sintering aid can be intermixed with the raw materials. For example, in some embodiments, tetraethyl orthosilicate (TEOS) can be added to the raw materials to provide the desired amount of sintering aid. In one embodiment, about 0.05% to about 5% by weight of TEOS is provided in the assembly. In some embodiments, the amount of TEOS may be between about 0.3% and about 1% by weight.

Various plasticizers may also be included, in some embodiments, to reduce the glass transition temperature and/or improve flexibility of the ceramic. Non-limiting examples of plasticizers include dicarboxylic/tricarboxylic ester-based plasticizers, such as bis(2-ethylhexyl) phthalate, diisononyl phthalate, bis(n-butyl)phthalate, butyl benzyl phthalate, diisodecyl phthalate, di-n-octyl phthalate, diisooctyl phthalate, diethyl phthalate, diisobutyl phthalate, and di-n-hexyl phthalate; adipate-based plasticizers, such as bis(2-ethylhexyl)adipate, dimethyl adipate, monomethyl adipate, and dioctyl adipate; sebacate-based plasticizers, such as dibutyl sebacate, and maleate; dibutyl maleate; diisobutyl maleate; polyalkylene glycols such as polyethylene glycol, polypropylene glycol, and copolymers thereof; benzoates; epoxidized vegetable oils; sulfonamides, such as N-ethyl toluene sulfonamide, N-(2-hydroxypropyl)benzene sulfonamide, and N-(n-butyl) benzene sulfonamide; organophosphates, such as tricresyl phosphate, tributyl phosphate; glycols/polyethers, such as triethylene glycol dihexanoate, tetraethylene glycol diheptanoate; alkyl citrates, such as triethyl citrate, acetyl triethyl citrate, tributyl citrate, acetyl tributyl citrate, trioctyl citrate, acetyl trioctyl citrate, trihexyl citrate, acetyl trihexyl citrate, butyryl trihexyl citrate, and trimethyl citrate; alkyl sulphonic acid phenyl ester; and mixtures thereof.

In some embodiments, the process may be made easier by occasionally adding binder resin and solvent to the raw powders. A binder is any substance that improves adhesion of the particles of the composition being heated to form a composite. Some non-limiting examples of binders include polyvinyl alcohol, polyvinyl acetate, polyvinyl chloride, polyvinyl butyral, polystyrene, polyethylene glycol, polyvinylpyrrolidones, polyvinyl acetates, and polyvinyl butyrates, etc. In some, but not all, circumstances, it may be useful for the binder to be sufficiently volatile that it can be completely removed or eliminated from the precursor mixture during the sintering phase. Solvents which may be used include, but not limited to water, a lower alkanol such as but not limited to denatured ethanol, methanol, isopropyl alcohol and mixtures thereof, preferably denatured ethanol, xylenes, cyclohexanone, acetone, toluene and methyl ethyl ketone, and mixtures thereof. In a preferred embodiment, the solvent is a mixture of xylenes and ethanol.

In some embodiments, the dispersants can be Flowen, fish oil, long chain polymers, steric acid, oxidized Menhaden fish oil, dicarboxylic acids such succinic acid, orbitan monooleate, ethanedioic acid, propanedioic acid, pentanedioic acid, hexanedioic acid, heptanedioic acid, octanedioic acid, nonanedioic acid, decanedioic acid, o-phthalic acid, p-phthalic acid and mixtures thereof.

In some embodiments, organic particles can be added to impart porosity to one or more layers in the final emissive ceramic. The organic particles can be any of those discussed above with respect to the assembly. For example, organic particles can be crosslinked polymethylmethacrylate beads. In some embodiments, the average largest dimension of the organic particles can be in the range of about 0.5 μm to about 50 μm. Moreover, the amount of the organic particles can be selected based on the desired pore volume percentage for any porous region in the final emissive ceramic.

The mixture may then be subjected to comminution to form a slurry by, for example, ball milling the mixture for a time period in the range of about 0.5 hrs. to about 100 hrs. (preferably about 6 hrs. to about 48 hrs., or more preferably about 12 hrs. to about 24 hrs.). The ball milling may utilize milling balls that include materials other than the components intermixed within the mixture (e.g., the milling balls may be $ZrO_2$ for a mixture that forms YAG). In an embodiment, the ball milling includes isolating the milling balls after a period of time by filtration or other known methods of isolation. In some embodiments, the slurry has a viscosity in the range of about 10 cP to about 5000 cP (preferably about 100 cP to about 3000 cP, or more preferably about 400 cP to 1000 cP).

Third, the slurry may be cast on a releasing substrate (e.g., a silicone coated polyethylene teraphthalate substrate) to form a tape. For example, the slurry may be cast onto a moving carrier using a doctor blade and dried to form a tape. The thickness of the cast tape can be adjusted by changing the gap between the doctor blade and the moving carrier. In some embodiments, the gap between the doctor blade and the moving carrier is in the range of about 0.125 mm to about 1.25 mm (preferably about 0.25 mm to about 1.00 mm, or more preferably about 0.375 mm to about 0.75 mm). Meanwhile, the speed of the moving carrier can have a rate in the range of about 10 cm/min. to about 150 cm/min. (preferably about 30 cm/min. to about 100 cm/min., or more preferably about 40 cm/min. to about 60 cm/min.). By adjusting the moving carrier speed and the gap between the doctor blade and moving carrier, the tape can have a thickness between about 20 μm and about 300 μm. The tapes may optionally be cut into desired shapes after casting.

Two or more tapes are laminated to form the assembly. The lamination step can include stacking two or more tapes (e.g., 2 to 100 tapes are stacked) and subjecting the stacked tapes to heat and uniaxial pressure (e.g., pressure perpendicular to the tape surface). For example, the stacked tapes may be heated above the glass transition temperature ($T_g$) of the binder contained in the tape and compressed uniaxially using metal dies. In some embodiments, the uniaxial pressure is in the range of about 1 to about 500 MPa (preferably about 30 MPa to about 60 MPa). In some embodiments, the heat and pressure is applied for a time period in the range of about 1 min. to about 60 min. (preferably about 15 min. to about 45 min., or more preferably about 30 min.). The lamination step may optionally include forming various shapes (e.g., holes or pillars) or patterns into the assembly by, for example, using shaped dies.

Some embodiments of the assembly include at least one tape that contains yttrium aluminum garnet or its precursor, and is substantially free of dopant. In addition, the assembly includes at least one tape having yttrium aluminum garnet or its precursor, and a dopant. The stacked tapes can be arranged to obtain the desired assembly configuration and layer thicknesses. For example, the tapes may be stacked to obtain the configurations illustrated in FIGS. 5A and 5B or 6A and 6B. The thickness of the doped layer and one or more non-doped layers can be modified by changing the number of tapes in the assembly. For example, to obtain a thicker non-doped layer, additional layers of tape can be added to the assembly.

The assembly may optionally include at least one tape having organic particles. In some embodiments, the assembly includes at least one tape having organic particles and at least one tape that is substantially free of organic particles. In some embodiments, the assembly includes at least one tape having a first size of organic particles and at least one tape having a second size of organic particles, where the first size of organic particles is different than the second size of organic particles. In some embodiments, the assembly includes at least one tape having a first amount by weight of organic particles and at least one tape having a second amount by weight of organic particles, where the first amount is different than the second amount.

Sintering the Assembly

The methods disclosed herein can include sintering the assembly to obtain the emissive ceramic. A person skilled in the art, guided by the teachings of the present application, can select appropriate configurations for the assembly and sintering conditions to obtain an emissive ceramic such as those disclosed herein having a dopant concentration gradient.

Without being bound to any particular theory, it is believed that the processes disclosed herein cause dopant to diffuse out of the doped layer and into the non-doped layer. This diffusion process creates the dopant concentration gradient in the final emissive ceramic. Diffusion is generally described as the movement of a species (e.g., dopant) from a region of high concentration to a region of low concentration. Accordingly, dopant may diffuse from the doped layer having a high dopant concentration to the non-doped layer having a lower dopant concentration.

The relative concentration across the thickness of the emissive ceramic obtained after sintering may be modeled using Fick's second law:

$$\frac{\partial C(x,t)}{\partial t} = D \frac{\partial^2 C(x,t)}{\partial x^2}$$

where x is a position along the thickness of the emissive ceramic; t is time; and C(x,t) is the dopant concentration at a position x. Various solutions are available to this equation depending upon the boundary conditions (e.g., initial configuration of the assembly). See for example J. Crank, *The Mathematics of Diffusion*, Oxford University Press, London 1956, which is hereby incorporated by reference in its entirety.

A simple solution is available for modeling an assembly configured as shown in FIGS. 5A and 5B. This solution, however, assumes that both the doped layer and non-doped layer are sufficiently thick such that the dopant concentration remains unchanged near the first and second surfaces along the thickness. If this assumption is reasonable, the dopant concentration gradient could be modeled as $$C(x, t) = \frac{1}{2}C_0\left(1 - \text{erfc}\frac{x}{2\sqrt{Dt}}\right),$$

where $C_0$ is the initial dopant concentration in the doped layer and x is the distance apart from the interface between the two layers. Most notably, this equation shows the slope of the diffusion gradient near the interface decreases over time. This change is also proportional to the diffusion coefficient. The diffusion coefficient generally increases exponentially with temperature. Also, the half-maximum dopant concentration will be near the interface between the two layers in this model.

Based on the above, it is apparent that the sintering conditions will affect the final dopant concentration profile. For example, sintering for longer periods of time will reduce the slope of the concentration gradient, and produce broader peaks. Meanwhile, increasing the sintering temperature will increase the diffusion coefficient, which can accelerate diffusion and produce a reduced slope in a shorter time period relative to lower sintering temperatures. Of course, the equations provided above merely provide a simplified model that may be used by the skilled artisan to select appropriate sintering conditions to obtain a desired dopant concentration profile. The skilled artisan will recognize that these equations merely serve as a guide because the underlying assumptions are not always applicable. For example, Fick's second law assumes that the diffusion coefficient is constant regardless of the concentration. However, this assumption is not always appropriate.

Accordingly, the processes disclosed herein include having at least a portion of the dopant diffuse out of the doped layer. In some embodiments, at least 30% of the dopant diffuses out of the doped layer during the process. In some embodiments, at least 40% of the dopant diffuses out of the doped layer during the process. In some embodiments, at least 50% of the dopant diffuses out of the doped layer during the process. In some embodiments, at least 60% of the dopant diffuses out of the doped layer during the process. In some embodiments, at least 70% of the dopant diffuses out of the doped layer during the process.

At least a portion of the dopant may diffuse into a non-doped layer. For example, about 30% of the dopant in the doped layer may diffuse into the non-doped layer. In some embodiments, at least a portion of the dopant may diffuse into a first non-doped layer and a second non-doped layer. As an example, at least about 20% of the dopant in the doped layer may diffuse into the first non-doped layer, and at least about 20% of the dopant in the doped layer may diffuse into the second non-doped layer, Some embodiments have a first amount of dopant in the doped layer that diffuses into a first non-doped layer and a second amount of dopant in the doped layer that diffuses into a second non-doped layer during sintering. The relative values of the first amount and second amount may be modified, in part, by the geometry of the assembly. For example, a thicker first non-doped layer may receive a higher amount dopant relative to a thinner second non-doped layer under appropriate conditions. The ratio of the first amount and the second amount may, for example, be in the range of about 4:1 and about 1:4; in the range of about 3:1 and about 1:3; or in the range of about 2:1 and 1:2. In some embodiments, the first amount and the second amount are about the same.

The first amount of dopant may, for example, be at least about 20% of the dopant in the doped layer; at least about 25% of the dopant in the doped layer; at least about 30% of the dopant in the doped layer; at least about 35% of the dopant in the doped layer; or at least about 40% of the dopant in the doped layer. The second amount of dopant may, for example, be at least about 20% of the dopant in the doped layer; at least about 25% of the dopant in the doped layer; at least about 30% of the dopant in the doped layer; at least about 35% of the dopant in the doped layer; or at least about 40% of the dopant in the doped layer.

The sintering conditions may also be adjusted to control the maximum dopant concentration in the emissive ceramic relative to the initial maximum dopant concentration of the doped layer in the assembly (e.g., before sintering). For example, an assembly having a 0.5 at % Ce doped layer may be sintered to produce an emissive ceramic having a dopant concentration gradient with a maximum dopant concentration of about 0.25 at % Ce. Thus, in this case, the maximum dopant concentration is about 50% of the initial maximum dopant concentration in the doped layer. In some embodiments, the dopant concentration gradient of the emissive ceramic includes a maximum dopant concentration that is no more than about 65% of the initial dopant concentration in the doped layer of the assembly. The dopant concentration gradient of the emissive ceramic may also include, for example, a maximum dopant concentration that is no more than about 60% of the initial dopant concentration in the doped layer of the assembly; no more than about 55% of the initial dopant concentration in the doped layer of the assembly; no more than about 50% of the initial dopant concentration in the doped layer of the assembly; no more than about 40% of the initial dopant concentration in the doped layer of the assembly; or no more than about 25% of the initial dopant concentration in the doped layer of the assembly.

Prior to sintering, an optional debinding process may be completed. The debinding process includes decomposing at least a portion of organic components within the assembly (e.g., volatilize binders, organic particles, and plasticizers within the assembly). As an example, the assembly may be heated in air to a temperature in the range of about 300° C. to about 1200° C. (preferably about 500° C. to about 1000° C., or more preferably about 800° C.) at a rate of about 0.1° C./min. to about 10° C./min. (preferably about 0.3° C./min. to about 5° C./min., or more preferably about 0.5° C./min. to about 1.5° C./min). The heating step may also include maintaining the temperature for a time period in the range of about 30 min. to about 300 min., which may be selected based upon the thickness of the assembly.

The assembly may be sintered in a vacuum, air, $O_2$, $H_2$, $H_2/N_2$, or a noble gas (e.g., He, Ar, Kr, Xe, Rn, or combinations thereof) at a temperature in the range of about 1200° C. to about 1900° C. (preferably about 1300° C. to about 1800° C., or more preferably about 1350° C. to about 1700° C.) for a time period in the range of about 1 hr. to about 20 hrs (preferably about 2 hrs. to about 10 hrs.). In some embodiments, the debinding and sintering processes are completed in a single step.

The assembly may be sandwiched between cover plates during the heating step to reduce distortion (e.g., warping, cambering, bending, etc.) of the assembly. The cover plates may include materials having a melting point above the temperatures applied during the heating step. Moreover, the cover plate may be sufficiently porous to permit transport of volatilized components through the covering plates. As an example, the covering plate may be zirconium dioxide having a porosity of about 40%.

In some embodiments, the sintering or debindering conditions can be effective to volatilize any organic particles in the assembly. This can yield porous region(s) in the assembly that correspond to the size, amount, and location of organic particles in the assembly. In some embodiments, the organic particles can be volatilized during a separate heating step.

Lighting Apparatus and Methods of Using the Emissive Ceramic

Some embodiments provide a lighting apparatus having a light source and an emissive ceramic configured to receive at least a portion of the radiation emitted by the light source. The emissive ceramic may include a yttrium aluminum garnet region with a dopant concentration gradient, such as any of those disclosed above.

The light source may, in some embodiments, be configured to emit blue radiation. The blue radiation may, for example, have a wavelength of peak emission between about 360 nm and about 500 nm. In some embodiments, the light source emits radiation having a wavelength of peak emission between about 450 nm and about 500 nm. Some embodiments include a light source that is a semiconductor LED. As an example, the light source may be an AlInGaN based single crystal semiconductor material coupled to an electric source.

Figure 8:
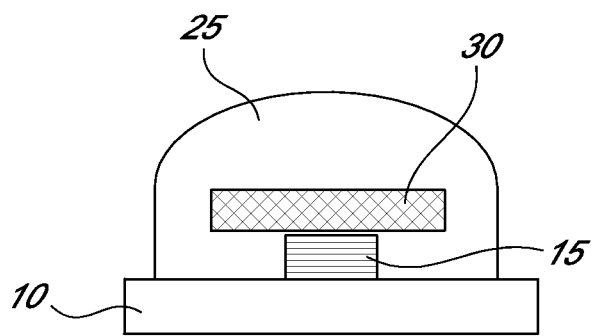
FIG. 8 is an example of a lighting apparatus that may include the emissive ceramics disclosed herein.

FIG. 8 is an example of a lighting apparatus that may include the emissive ceramics disclosed herein. A submount 10 has a light source 15, such as a conventional base LED mounted thereon. The light source 15 is adjacent to emissive layer 30 which receives at least a portion of the light emitted from the light source 15. An optional encapsulant resin 25 is placed over the light source 15 and the emissive layer 30. Emissive layer 30 can include any of the emissive ceramics disclosed in the present application.

In some embodiments, the lighting apparatus includes an emissive ceramic (e.g., emissive layer 30 depicted in FIG. 8) having a first porous region and second porous region, where the first porous region has a greater porosity (e.g., higher average pore size and/or higher pore volume percentage) than the second porous region. The second porous region may, for example, be disposed between the first porous region and the light source (e.g., light source 15).

Also disclosed herein are methods of producing light that include exposing any of the emissive ceramics disclosed in the present application to a blue radiation. The blue radiation may, for example, have a wavelength of peak emission between about 360 nm and about 500 nm. In some embodiments, the blue radiation has a wavelength of peak emission between about 450 nm and about 500 nm.

In some embodiments, the emissive ceramic (e.g., emissive layer 30 depicted in FIG. 8) having a first porous region and second porous region, where the first porous region has a greater porosity (e.g., higher average pore size and/or higher pore volume percentage) than the second porous region. The second porous region may be disposed between a first surface of the emissive ceramic and the first porous region. The method can include, for example, applying blue radiation to the first surface of the emissive ceramic.

EXAMPLES

Additional embodiments are disclosed in further detail in the following examples, which are not in any way intended to limit the scope of the claims.

Example 1

Non-Emissive Layers for Laminated Composite (Undoped Host Material)

A 50 ml high purity $Al_2O_3$ ball mill jar was filled with 55 g of $Y_2O_3$-stabilized $ZrO_2$ balls having a 3 mm diameter. In a 20 ml glass vial, 0.153 g dispersant (Flowlen G-700. Kyoeisha), 2 ml xylene (Fisher Scientific, Laboratory grade) and 2 ml ethanol (Fisher Scientific, reagent alcohol) were mixed until the dispersant was dissolved completely. The dispersant solution and tetraethoxysilane as sintering aid (0.038 g, Fluka) were added to a ball mill jar.

$Y_2O_3$ powder (3.984 g, 99.99%, lot N-YT4CP, Nippon Yttrium Company Ltd.) with a BET surface area of 4.6 $m^2/g$ and $Al_2O_3$ powder (2.998 g, 99.99%, grade AKP-30, Sumitomo Chemicals Company Ltd.) with a BET surface area of 6.6 $m^2/g$ were added to ball mill jar. The total powder weight was 7.0 g and the ratio of $Y_2O_3$ to $Al_2O_3$ was at a stoichiometric ratio of 3:5. A first slurry was produced by mixing the $Y_2O_3$ powder, the $Al_2O_3$ powder, dispersant, tetraethoxysilane, xylenes, and ethanol by ball milling for 24 hours.

A solution of binder and plasticizers was prepared by dissolving 3.5 g poly(vinyl butyral-co-vinyl alcohol-co-vinyl acetate) (Aldrich), 1.8 g benzyl n-butyl phthalate (98%, Alfa Aesar), and 1.8 g polyethylene glycol (Mn=400, Aldrich) in 12 ml xylene (Fisher Scientific, Laboratory grade) and 12 ml ethanol (Fisher Scientific, reagent alcohol). A second slurry was produced by adding 4 g of the binder solution into the first slurry and then milling for another 24 hours. When ball milling was complete, the second slurry was passed through a syringe-aided metal screen filter with pore size of 0.05 mm. Viscosity of second slurry was adjusted to 400 centipoise (cP) by evaporating solvents in the slurry while stirring at room temperature. The slurry was then cast on a releasing substrate, e.g., silicone coated Mylar® carrier substrate (Tape Casting Warehouse) with an adjustable film applicator (Paul N. Gardner Company, Inc.) at a cast rate of 30 cm/min. The blade gap on the film applicator was set at 0.381 mm (15 mil). The cast tape was dried overnight at ambient atmosphere to produce a green sheet of about 100 µm thickness.

Example 2

Non-Emissive Layers for Laminated Composite ($Al_2O_3$ Material)

The non-emissive layers were made in accordance with Example 1, except that $Al_2O_3$ (5 g, 99.99%, grade AKP-30, Sumitomo Chemicals Company Ltd.) with BET surface area of 6.6 $m^2/g$ was used instead of $Y_2O_3$ and $Al_2O_3$ powder as described above for the $Al_2O_3$ green sheet preparation. A green sheet of about 100 um thickness was produced.

Example 3

Plasma Laminate for Emissive Layers

Plasma-produced amorphous yttrium aluminum oxide (with stoichiometry Y:Al:O=3:5:12) powders (5.2 g) containing 1.0 at % cerium with respect to yttrium with a BET surface area of about 20 m$^2$/g was added to a high purity alumina combustion boat followed by annealing in a tube furnace (MTI GSL-1600) at heating ramp of 3-5° C./min to 1350° C. in air or 3% H$_2$/97% N$_2$ for 2 hrs. Then, it was cooled down to room temperature at a ramp of 5° C./min. Yellow color powder with a BET surface area of 4.6 m$^2$/g was obtained after annealing.

A 50 ml high purity Al$_2$O$_3$ ball mill jar was filled with 24 g Y$_2$O$_3$ stabilized ZrO$_2$ ball of 3 mm diameter. Then, in a 20 ml glass vial, 0.084 g dispersant (Flowlen G-700. Kyoeisha), 2 ml xylene (Fisher Scientific, Laboratory grade), and 2 ml ethanol (Fisher Scientific, reagent alcohol) were mixed until the dispersant was dissolved completely. The dispersant solution and tetraethoxysilane as a sintering aid (0.045 g 99.0% pure, Fluka) were added to a ball mill jar. The annealed plasma YAG powder (3.0 g) with a BET surface area of 4.6 m$^2$/g, was added to a ball mill jar. The first slurry was produced by mixing the YAG powder, dispersant, tetraethoxysilane, xylenes, and ethanol by ball milling for 24 hours.

A solution of binder and plasticizers was prepared by dissolving 5.25 g poly(vinyl butyral-co-vinyl alcohol-co-vinyl acetate) (Aldrich), 2.6 g benzyl n-butyl phthalate (98%, Alfa Aesar), and 2.6 g polyethylene glycol (Mn=400, Aldrich) in 18 ml xylene (Fisher Scientific, Laboratory grade) and 18 ml ethanol (Fisher Scientific, reagent alcohol). A second slurry was produced by adding 1.2 g of the binder solution into the first slurry and then milling another 24 hours. When ball milling was complete, the second slurry was passed through a syringe-aided metal screen filter with pore size of 0.05 mm. The viscosity of the second slurry was adjusted to 400 centipoise (cP) by evaporating solvents in the slurry while being stirred at room temperature. The slurry was then cast on a releasing substrate, e.g., silicone coated Mylar® carrier substrate (Tape Casting Warehouse) with an adjustable film applicator (Paul N. Gardner Company, Inc.) at a cast rate of 30 cm/min. The blade gap on the film applicator was set at 0.127 mm (5-mil). The cast tape was dried overnight at ambient atmosphere to produce a yellow-colored green sheet of about 40 μm thickness.

Example 4

YAG Ceramics for Setting Up Calibration Curve in TOF-SIMS (Time-of-Flight Secondary Ion Mass Spectroscopy)

Plasma-YAG green sheet for making YAG:Ce ceramics as standard samples to set up a calibration curve were prepared by following the same processing procedures as described in Example 3. The prepared green sheets contained 0.5 at %, 1.0 at % and 1.5 at % of Ce respectively. A YAG green sheet was prepared by a solid state reaction using the same processing procedures as described in Example 1. The prepared green sheet did not contain Ce.

Example 5

Laminate Composites

The green sheets of non-emissive (e.g., un-doped host material) comprise Y$_2$O$_3$ and Al$_2$O$_3$ powders at an atomic ratio of 3:5, each sheet having a thickness of about 100 μm. The emissive green sheets comprise pre-annealed plasma-synthesized YAG:Ce powder containing about 1.0 at % Ce (40 μm thickness). The Al$_2$O$_3$ green sheets comprise Al$_2$O$_3$ powders with a thickness of 100 μm. These green sheets were cut into circular shapes of about 13 mm in diameter with laser cutter. By varying the number of cut non-emissive, emissive and Al$_2$O$_3$ pieces, several laminate composites were constituted as set forth in Table 1.

TABLE 1

Assembly Configurations

| Sample | Doped layer | Non-doped layer |
|---|---|---|
| 1 [2-1-2] | 1 × (40 μm) $(Y_{0.99}Ce_{0.01})_3Al_5O_{12}$ | 2 (2 × (100 μm) YAG non-doped) |
| 2 [2-3-2] | 1 × (40 μm) $(Y_{0.995}Ce_{0.005})_3Al_5O_{12}$ 1 × (40 μm) $(Y_{0.99}Ce_{0.01})_3Al_5O_{12}$ 1 × (40 μm) $(Y_{0.995}Ce_{0.005})_3Al_5O_{12}$ | 2 (2 × (100 μm) YAG non-doped) |
| 3 [2-3-2] | 3 × (40 μm) $(Y_{0.99}Ce_{0.01})_3Al_5O_{12}$ | 2 (2 × (100 μm) Al$_2$O$_3$) |

In Table 1, [2-1-2] refers to a lamination of two non-emissive layers on each side of one emissive layer. Meanwhile, [2-3-2] refers to a lamination of two non-emissive layers on each side of a composite 3×40 μm emissive layer.

The respective pieces of punched circular-shaped undoped green sheet and plasma YAG:Ce green sheet were placed between circular dies with mirror-polished surfaces and heated on a hot plate to 80° C., followed by compression in a hydraulic press at a uniaxial pressure of 5 metric tons and held at that pressure for 5 minutes. Laminated composites of emissive and non-emissive layers were thus produced.

For debindering, laminated green sheets were sandwiched between ZrO$_2$ cover plates (1 mm in thickness, grade 42510-X, ESL Electroscience Inc.) and placed on an Al$_2$O$_3$ plate of 5 mm thick; then heated in a tube furnace in air at a ramp rate of 0.5° C./min to 800° C. and held for 2 hours to remove the organic components from the green sheets.

After debindering, the assembly was annealed at 1500° C. at 20 Torr for 5 hours at a heating rate of 1° C./min to complete conversion from non-garnet phases of Y—Al—O in the non-emissive layer, including, but not limited to, amorphous yttrium oxides, YAP, YAM or Y$_2$O$_3$ and Al$_2$O$_3$ to yttrium aluminum garnet (YAG) phase and increase the final YAG grain size.

Following the first annealing, the assembly were further sintered in a vacuum of 10$^{-3}$ Torr at about 1700° C. for 5 hours at a heating rate of 5° C./min and a cooling rate of 10° C./min to room temperature to produce a translucent YAG ceramic sheet of about 0.4 mm thickness. Brownish sintered ceramic sheets were reoxidized in a furnace at 20 Torr at 1400° C. for 2 hrs at heating and cooling rates of 10° C./min and 20° C./min 20 Torr respectively. The sintered laminated composite exhibited transmittance greater than 70% at 800 nm. When irradiated with a blue LED with peak emission wavelength at 455 nm, no clear boundary between emissive and non-emissive layer can be observed, which indicates that significant diffusion of cerium occurred from the doped plasma YAG layer to the non-doped YAG layer.

Example 6

IQE Measurement Results of Laminated Composite

IQE measurements were performed with an Otsuka Electronics MCPD 7000 multi channel photo detector system (Osaka, JPN) together with required optical components such as integrating spheres, light sources, monochromator, optical fibers, and sample holder as described below.

The YAG:Ce phosphor ceramics plate constructed as described above, with a diameter of about 11 mm, were placed on a light emitting diode (LED) with peak wavelength at 455 nm with acrylic lens which had a refractive index of about 1.45. An LED with YAG:Ce was set up inside integration sphere. The YAG:Ce ceramics plate was irradiated by the LED and the optical radiation of blue LED and YAG:Ce ceramics were recorded respectively. Next, the YAG:Ce ceramics plate was removed from LED, and then the radiation of blue LED with the acrylic lens were measured.

Figure 9:
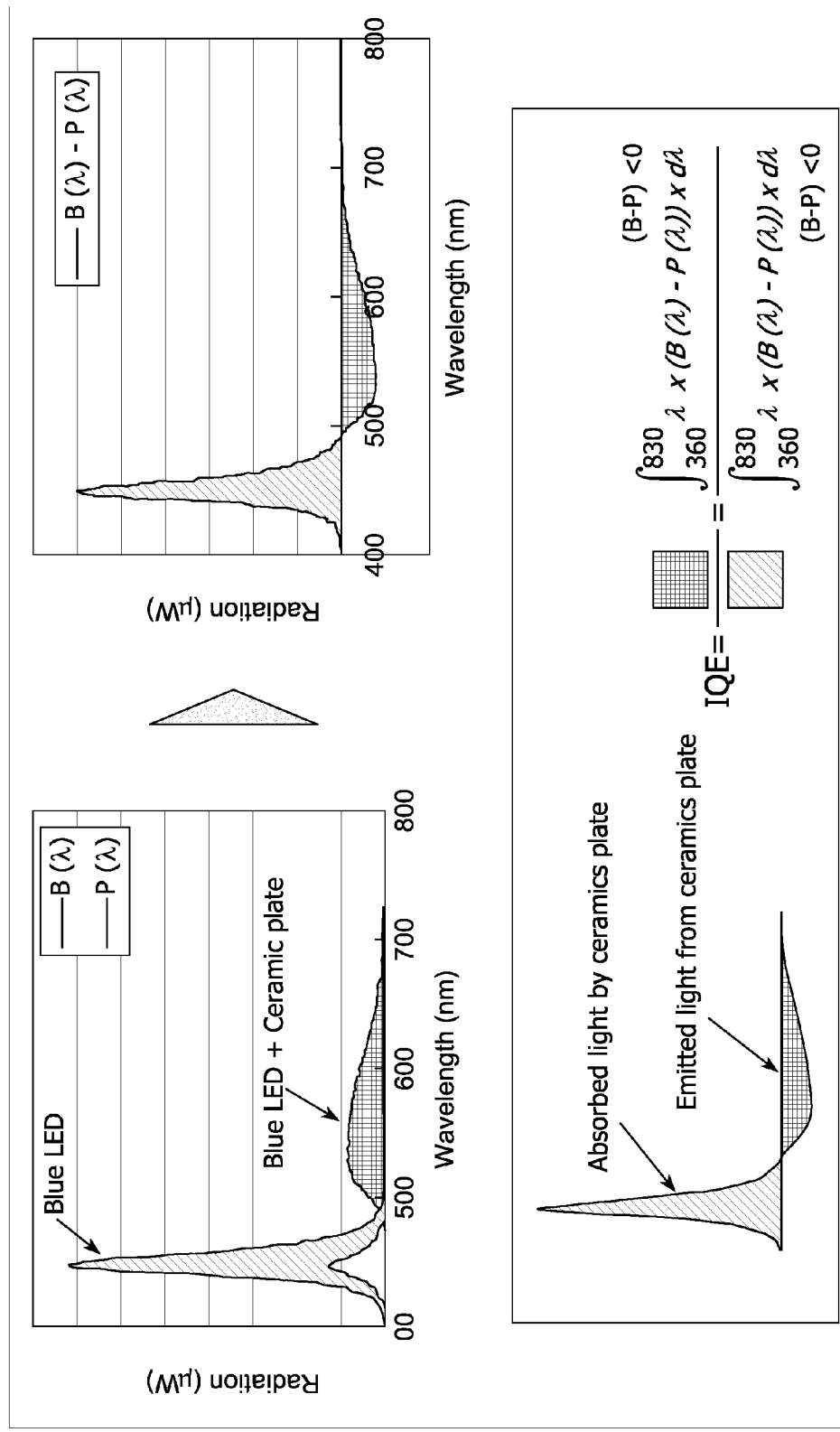
FIG. 9 is an example of how the Internal Quantum Efficiency (IQE) can be determined.

IQE was calculated by integration of the radiation difference from the blue only LED and blue LED/YAG:Ce combination as shown in FIG. 9. The IQE of the laminated composite samples was determined to be 90% (plasma-generated YAG with 40 µm thick layer of YAG:Ce (1.0 at % Ce) between 200 µm thick YAG undoped layers), 85% (plasma-generated YAG with 120 µm thick layer of YAG:Ce (1% wt Ce) between 200 um thick YAG undoped layers), and 55% (plasma-generated YAG with 40 µm thick layer of YAG:Ce (1% wt Ce) between 200 µm thick $Al_2O_3$ undoped layers.

Example 7

TOF-SIMS Analysis

Figure 10:
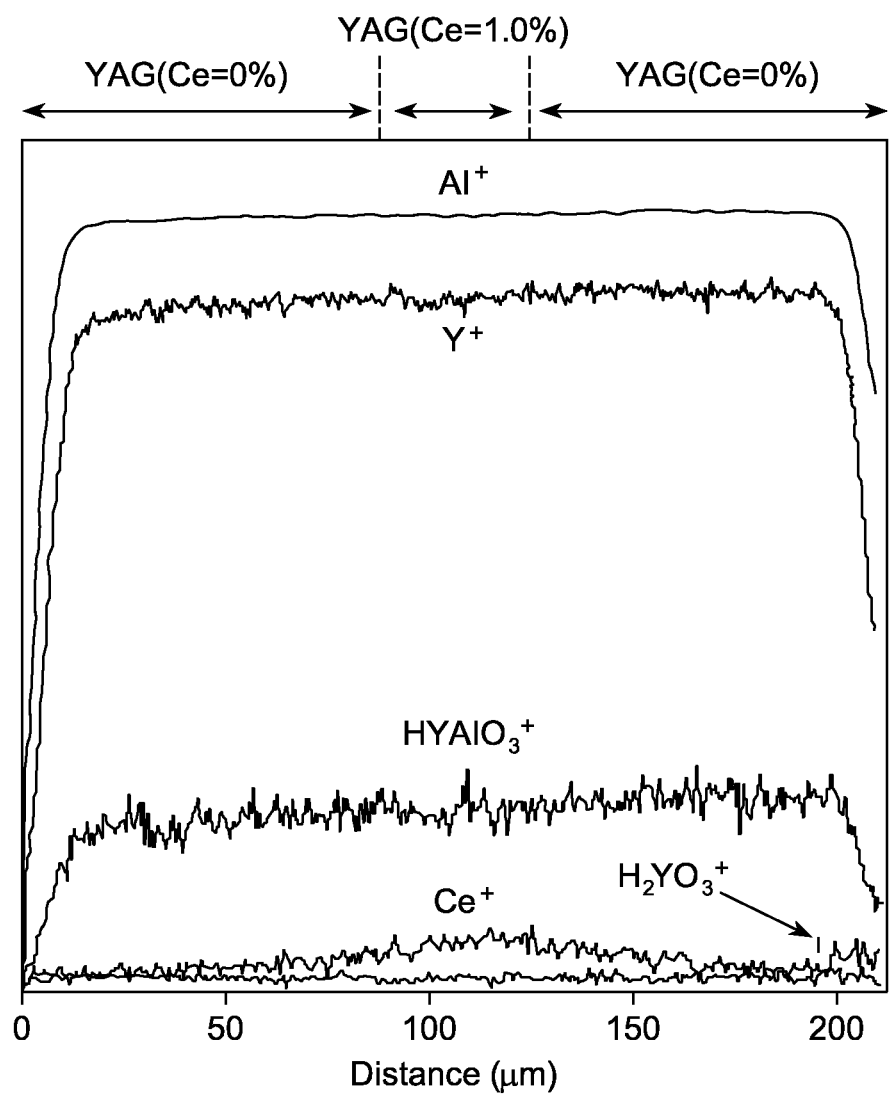
FIG. 10 shows TOF-SIMS (Time-Of-Flight Secondary Ion Mass Spectroscopy) results for the Sample 1 in Example 5.

The sintered ceramic obtained from Sample 1 in Example 5 was analyzed by TOF-SIMS (Time-Of-Flight Secondary Ion Mass Spectroscopy) and the results are shown in FIG. 10. As can be seen, Ce diffused into the non-doped layer as indicated by the tailing amount of Ce extending from about point A (the interface between the emissive and non-emissive layers) into the non-emissive layer at least about 100 µm. The Ce concentration decreased to about 0.45 units.

Figure 11:
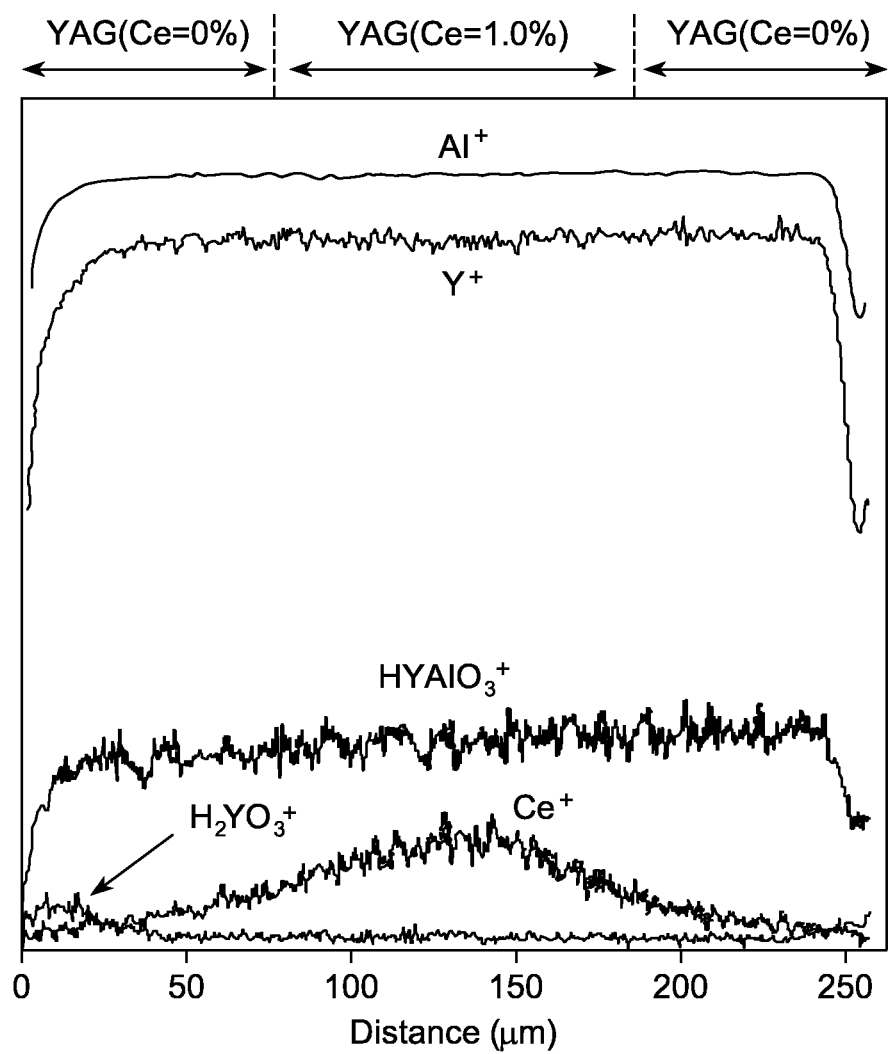
FIG. 11 shows TOF-SIMS (Time-Of-Flight Secondary Ion Mass Spectroscopy) results for the Sample 2 in Example 5.

The sintered ceramic obtained from Sample 2 in Example 5 was also analyzed by TOF-SIMS. As indicated in FIG. 11, the use of 120 µm/YAG (0% Ce) in conjunction with 200 µmm layers of YAG undoped layer reduced the diffusion of Ce. This produced a maximum concentration that remained essentially unchanged (e.g., about 10.0 units) after sintering.

Figure 12:
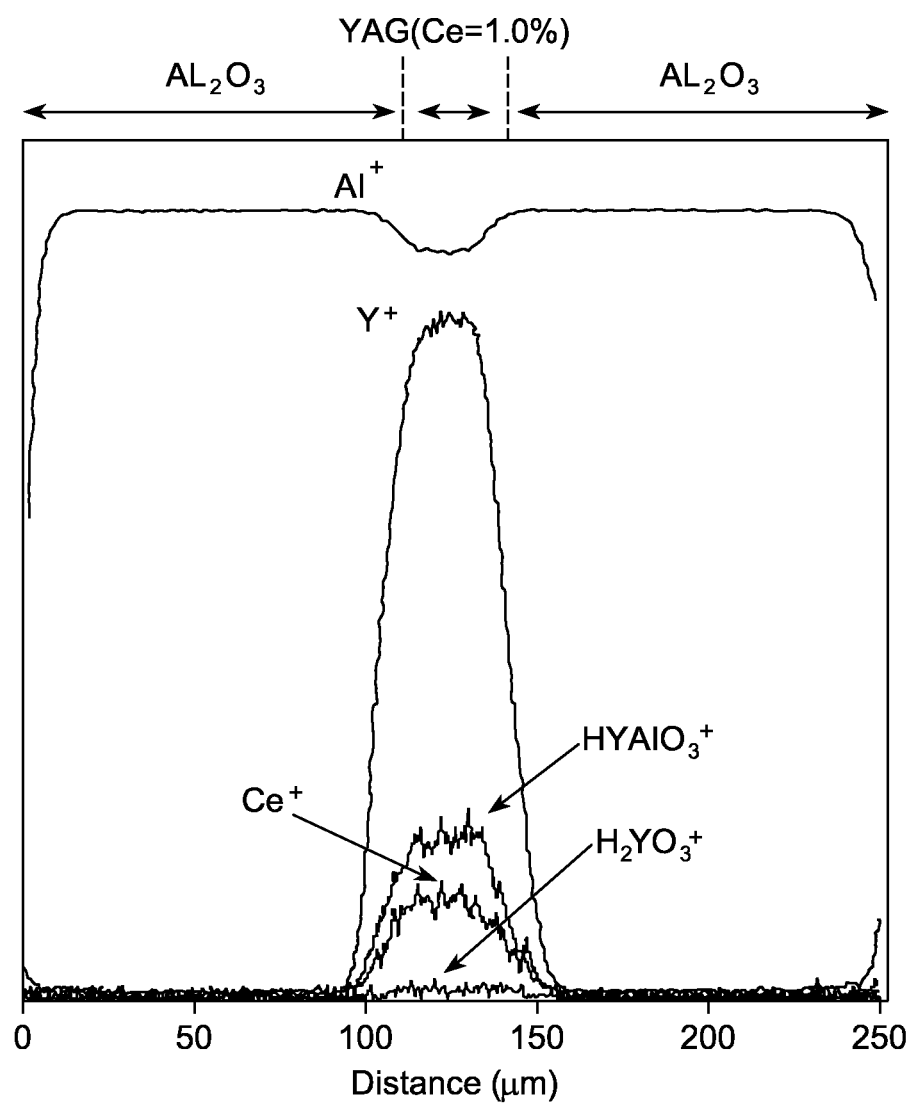
FIG. 12 shows TOF-SIMS (Time-Of-Flight Secondary Ion Mass Spectroscopy) results for the Sample 3 in Example 5.

As a comparison, the sintered ceramic obtained from Sample 3 in Example 5 was also analyzed was also analyzed by TOF-SIMS. As indicated in FIG. 12, the use of $Al_2O_3$ layer substantially blocked the diffusion of Ce and resulted in a non-emissive layer substantially free of dopant. Also, the maximum dopant concentration remained substantially the same (e.g., about 10.0 units) after sintering.

Example 8

Figure 13:
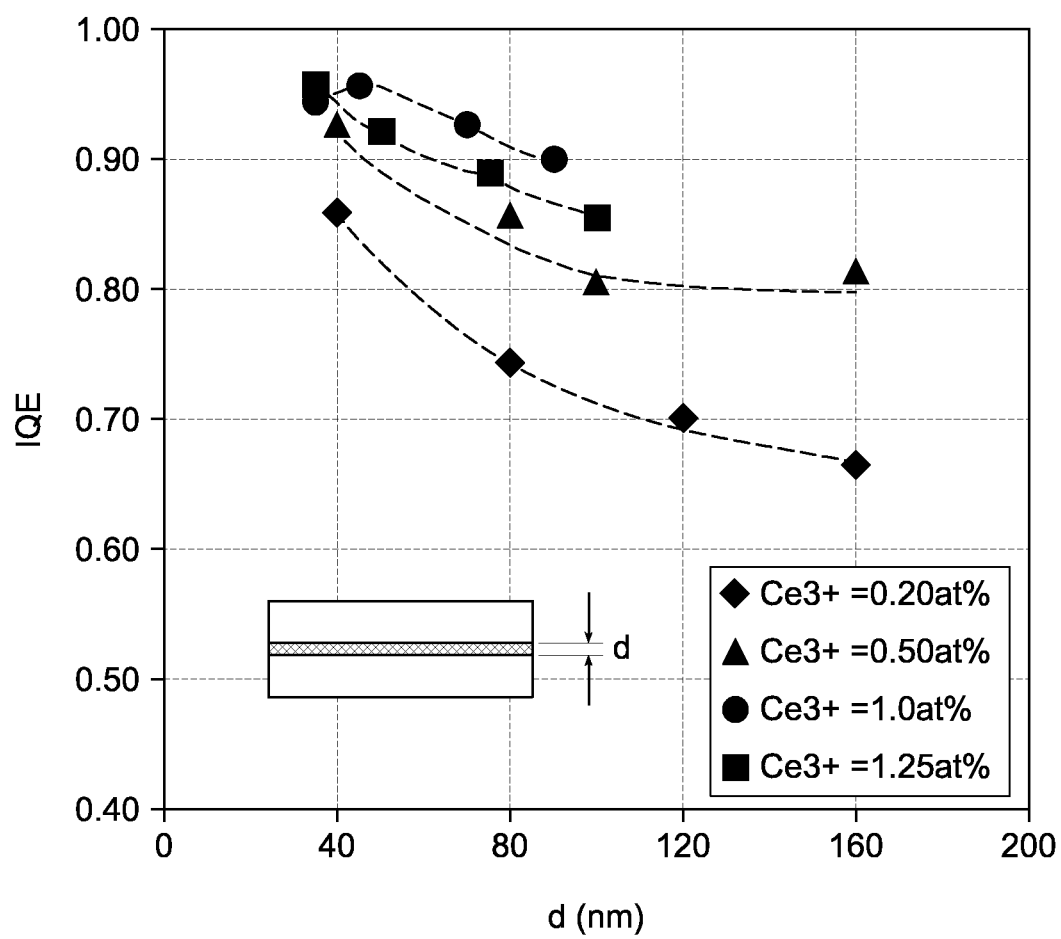
FIG. 13 shows IQE variation with emissive layer thickness in samples with a sandwich structure having varied dopant concentrations (Ce) in the range of 0.2 to 1.25 at %.

Sixteen different assemblies were prepared and sintered according to Examples 1, 3, and 5. The assembly included a doped layer sandwiched between two non-doped layers of about 200 µm thick (2 times 100 µm sheets laminated on each side). The doped layer had thicknesses ranging from about 30 to about 160 µm and concentrations ranging from 0.2% to about 1.25% Ce. The IQE for each composite tablet was determined as set forth above in Example 5. The results are shown in FIG. 13.

Example 9

Figure 14:
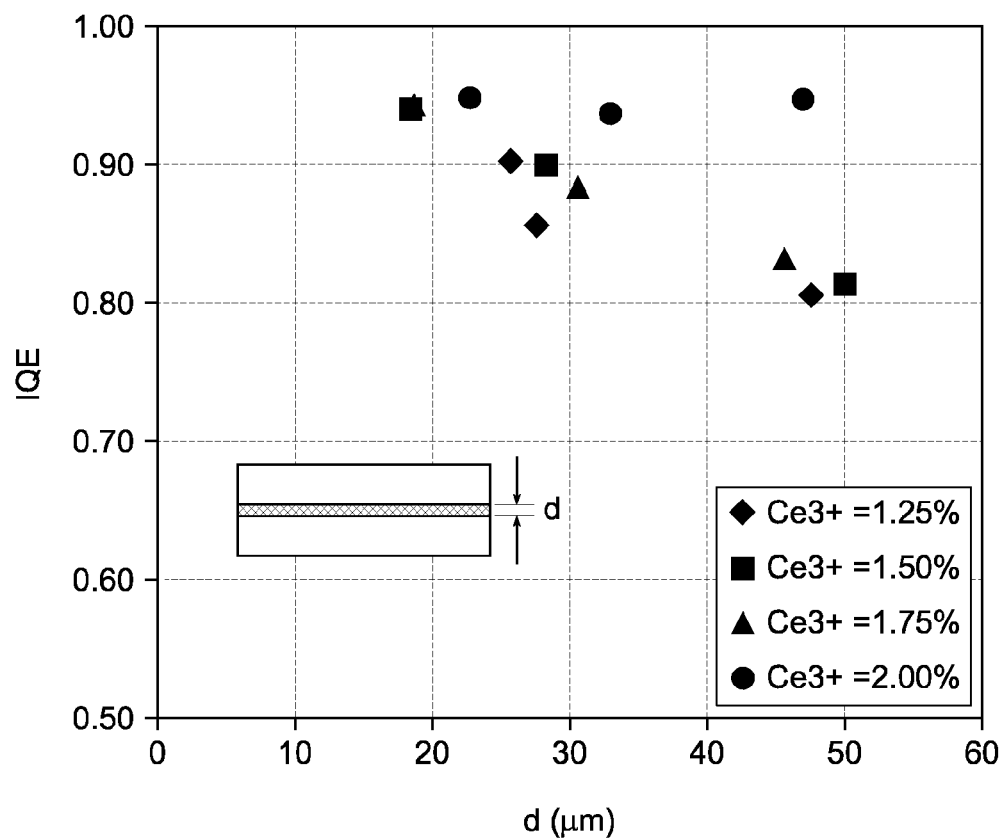
FIG. 14 shows IQE variation with emissive layer thickness in samples with a sandwich structure having varied dopant concentrations (Ce) in the range of 1.25 to 2.0 at %.
Figure 15:
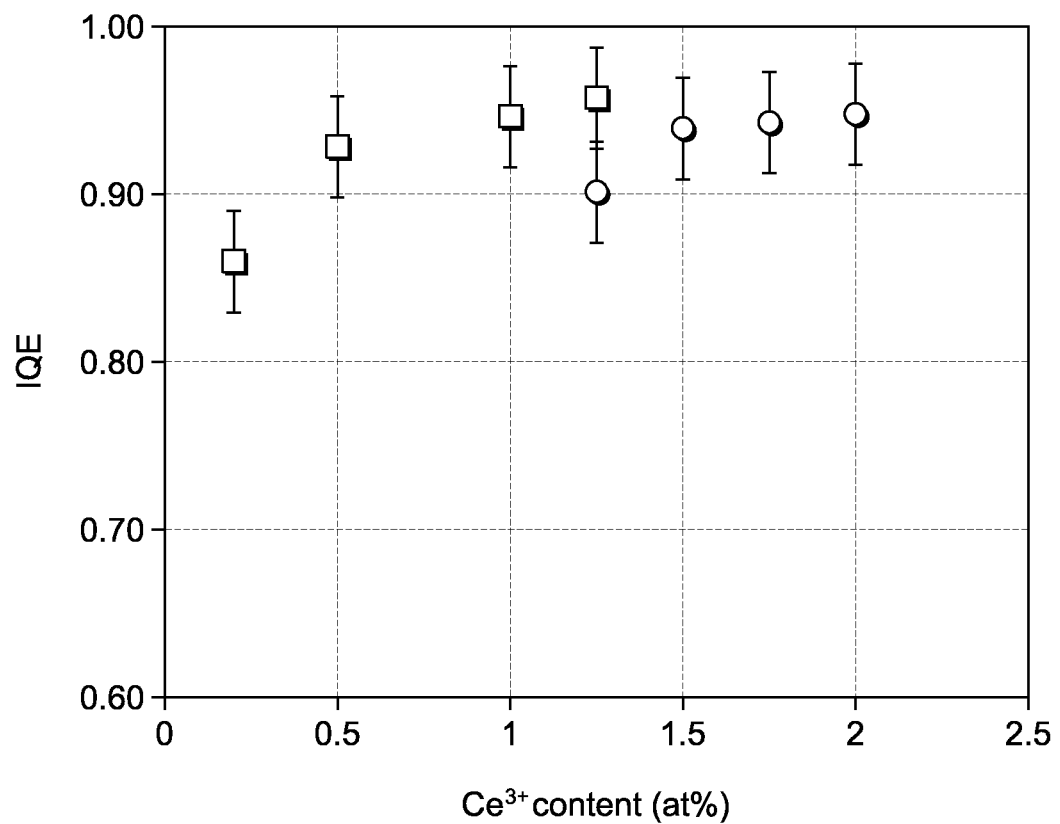
FIG. 15 is a graph showing IQE variation with dopant (Ce) concentration in YAG:Ce ceramics with a sandwich structure.

Nine different assemblies were prepared and sintered according to Examples 1, 3, and 5. The assembly included a doped layer sandwiched between two non-doped layers of about 200 µm thick (2 times 100 µm sheets laminated on each side). The doped layer had thicknesses ranging from about 20 to about 50 µm and concentrations ranging from 1.25% to about 2.0% Ce. The IQE for each composite tablet was determined as set forth above in Example 5. The results are shown in FIG. 14. FIG. 15 depicts the IQE plotted as a function of Ce concentration. The Figure indicates that the increasing IQE appears to plateau as the concentration exceeds 2.0 at %.

Example 10

Figure 16:
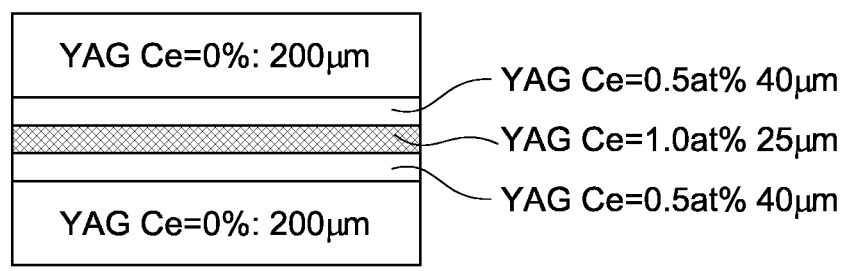
FIG. 16 shows a comparative sample of a structure before sintering that multiple doped sheets having different dopant (Ce) concentrations.
Figure 17:
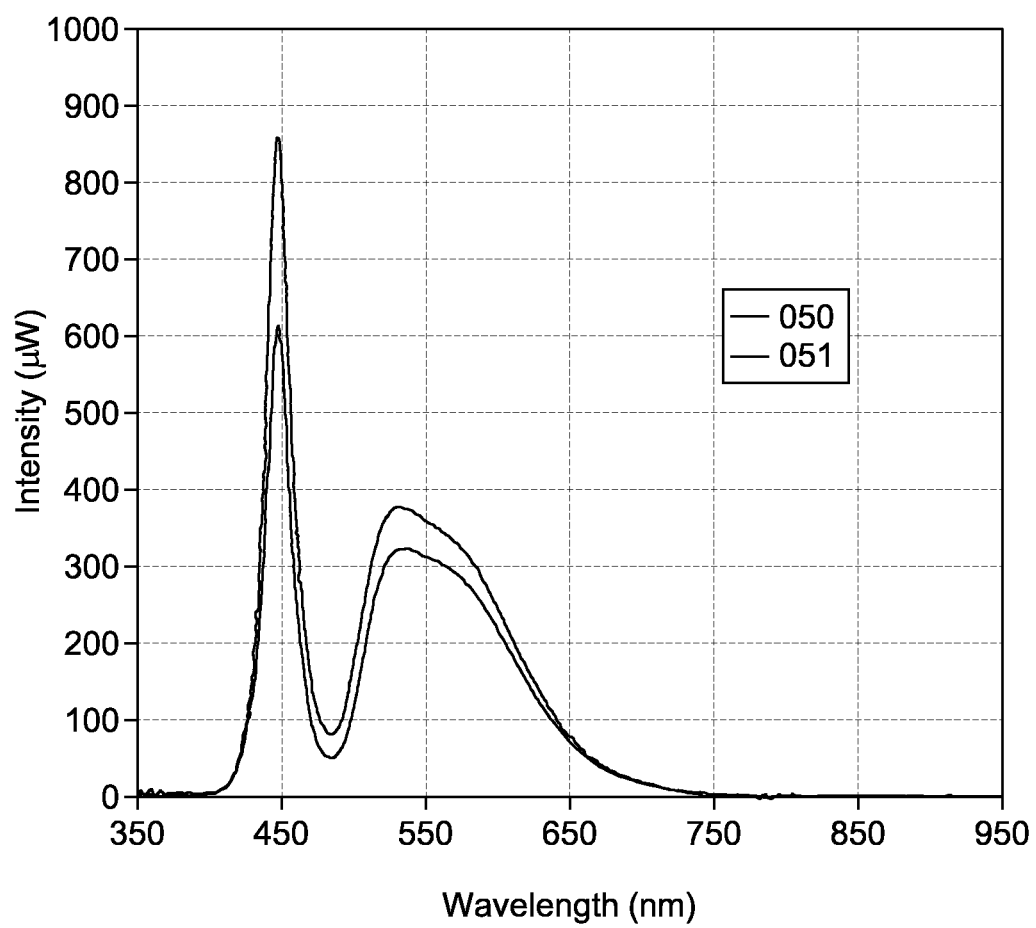
FIG. 17 shows intensity versus wavelength of luminescence of samples in Example 10.

The green sheets of non-emissive (e.g., un-doped) comprise $Y_2O_3$ and $Al_2O_3$ powders at an atomic ratio of 3:5, each sheet having a thickness of about 100 µm. The emissive green sheets comprise pre-annealed plasma-synthesized YAG:Ce powder containing about 2.0 at % Ce (37 µm thickness). A laminate of green sheet was constructed by placing two green sheets of non-emissive (200 µm) at each side of emissive layer. These green sheets were cut into circular shapes of about 13 mm in diameter with laser cutter. In a comparison sample, YAG:Ce laminates were constructed with a emissive layer comprising plasma-YAG:Ce green sheet containing 1.0 at % of Ce with plasma-YAG green sheets containing 0.5 at % of Ce on each side as showed in FIG. 16. The Ce concentration in the doped layer is roughly same, while the Ce concentration gradient in each structure is different. By following the procedures as described above for annealing and evaluation, IQE values were obtained and shown in FIG. 17. Sample labeled as 050 showed IQE of 0.93, whereas the sample labeled as 051 showed IQE of 0.71. This difference shows the dopant concentration gradient affects the IQE. A thin emissive layer with higher Ce concentration appears to be favorable for achieving high IQE through diffusion without concentration quenching.

Example 11

The green sheets of non-emissive (e.g., un-doped) comprise $Y_2O_3$ and $Al_2O_3$ powders at an atomic ratio of 3:5, each sheet having a thickness of about 100 µm were prepared as set forth in Example 1. In Samples 5-10, the emissive green sheets comprise pre-annealed plasma-synthesized YAG:Ce powder containing about 0.5 at % Ce (37 µm thickness), 1.5 at % Ce (28 µm thickness), 2.0 at % Ce (23 µm thickness), 0.2 at % Ce (160 µm thickness), 1.25 at % Ce (100 µm thickness), and 4.0 at % Ce (16 µm thickness) were prepared as set forth in Example 3, except that the respective desired Ce amount was used to attain the desired at % and the respective blade gap was selected to attain the desired preen sheet thickness, e.g., 0.127 mm (5-mil) for 37 µm, 0.127 mm (5-mil) for 28 µm, 0.127 mm (5-mil) for 23 µm, 0.127 mm (5-mil) for 40 µm and 4×40 um stacking for 160 µm, 0.254 mm (10 mil) for 50 µm and 2×50 µm stacking for 100 µm, 0.1016 mm (4-mil) for 16 µm.

In Sample 11, the emissive green sheet containing about 1.0 at % Ce (50 µm thickness) was prepared as set forth in Example 3 except the Ce amount was used to attain the desired at % and the respective blade gap was selected to attain the desired green sheet thickness, e.g., 0.254 mm (10 mil) for 50 µm, and comprised $Y_2O_3$ and $Al_2O_3$ powders as described in Example 1 ($Y_2O_3$ powder [3.984 g, 99.99%, lot N-YT4CP, Nippon Yttrium Company Ltd.] with a BET surface area of 4.6 $m^2$/g and $Al_2O_3$ powder [2.998 g, 99.99%, grade AKP-30, Sumitomo Chemicals Company Ltd.] with a BET surface area of 6.6 $m^2$/g).

A laminate of green sheet was constructed by placing two green sheets of non-emissive (200 um) at each side of the emissive layer as shown in FIG. 6. These green sheets were cut into circular shapes of about 13 mm in diameter using a laser cutter. By following the procedures as described in Example 4 for annealing except that they were annealed at 800° C. in air for removal of organic constituent and sintered at 1700° C. for about 5 hours in vacuum and evaluation, IQE values were obtained as shown in TABLE 2.

TABLE 2

Assembly Configurations and Resulting IQE for the Emissive Ceramic

| Sample | Non-doped Layer thicknesses | Doped Layer Thickness | Ce Conc. in Doped Layer | IQE |
|---|---|---|---|---|
| 5 | 200 μm | 40 μm | 0.5 at % | 0.93 |
| 6 | 200 μm | 28 μm | 1.5 at % | 0.90 |
| 7 | 200 μm | 23 μm | 2.0 at % | 0.95 |
| 8 | 200 μm | 160 μm | 0.2 at % | 0.67 |
| 9 | 200 μm | 100 μm | 1.25 at % | 0.86 |
| 10 | 200 μm | 16 μm | 4.0 at % | 0.79 |
| 11 | 200 μm | 50 μm | 1.0 at % | 0.94 |

Example 12

Samples 5-10 as prepared in Example 11 were also analyzed to provide a Time of Flight secondary Ion Mass Spectroscopy profile.

YAG:Ce ceramic plates were embedded in epoxy resin. After curing the embedding epoxy, the ceramic samples were mechanically polished. Surface contamination of the samples was removed by using Bismuth ion sputtering.

TOF-SIMS analysis was performed using a TOF-SIMS 5 (ION-TOF GmbH, Munster, Germany). The surface of the ceramic samples was irradiated with pulsing bismuth primary ions (Bi+) accelerated at 25 kV. To obtain mass spectrum, positive secondary ions emitted from samples were collected by reflectron-type time-of-flight mass analyzer and detected by a micro-channel plate detector with a post-acceleration energy of 10 kV. A low-energy electron flood gun was utilized for charge neutralization in the analysis mode.

Figure 18:
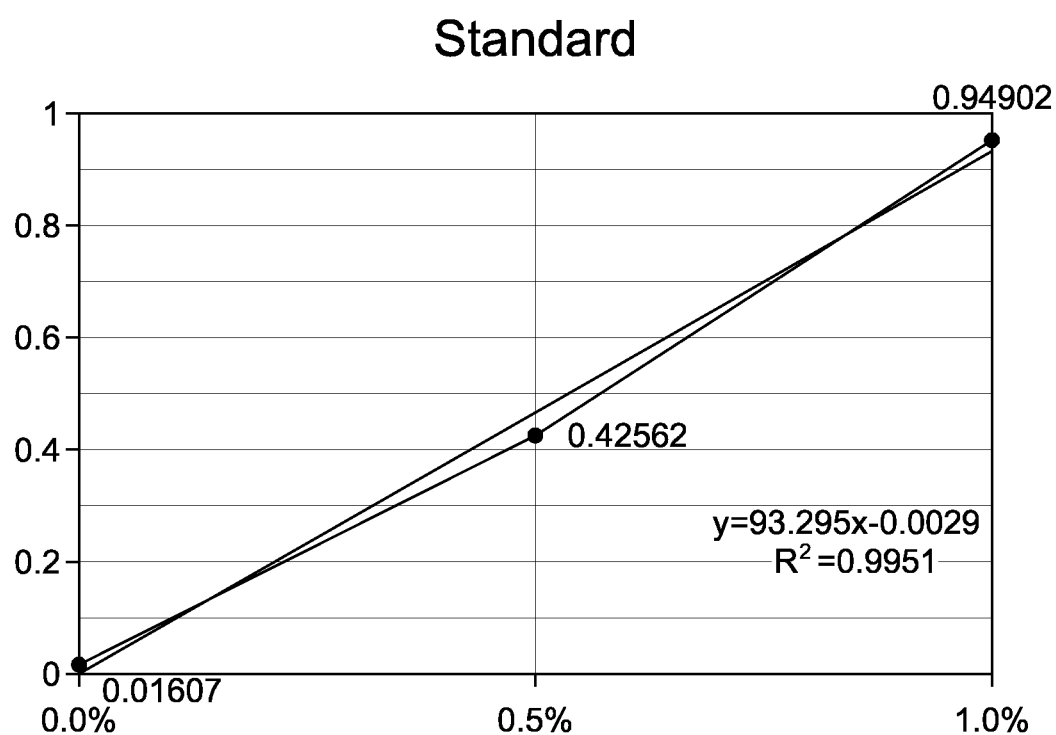
FIG. 18 shows a calibration curve, in which the ratio of cerium ion intensity (Ce+/Y+) in atomic percent was plot with changing Ce+ concentration, was prepared by using standard samples with different Ce+ concentration for a quantitative analysis.
Figure 19:
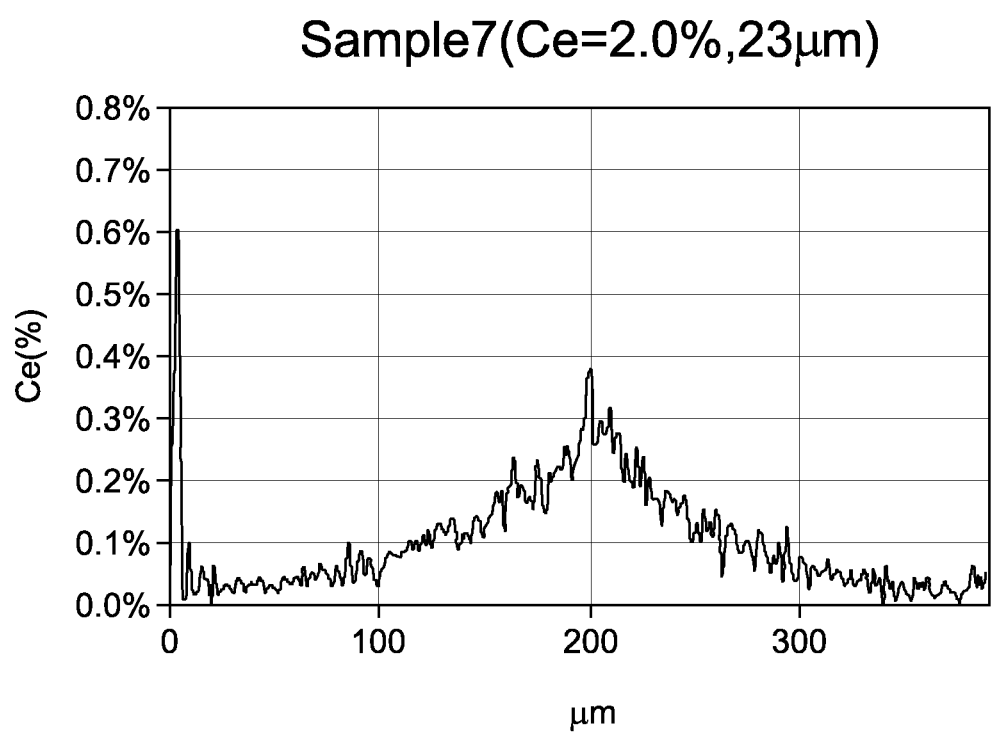
FIG. 19 shows the respective TOF-SIMS profile illustrating the diffusion of Ce % through the emissive region (Ce concentration [%] along the thickness [µm]) for Sample 7 of Example 12.
Figure 20:
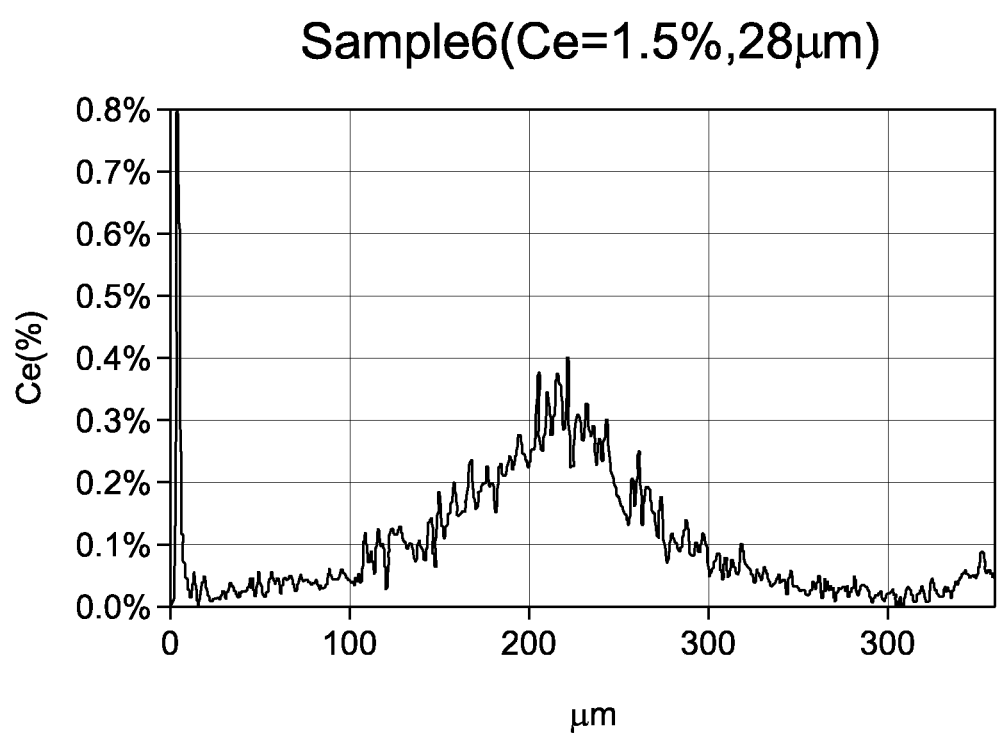
FIG. 20 shows the respective TOF-SIMS profile illustrating the diffusion of Ce % through the emissive region (Ce concentration [%] along the thickness [µm]) for Sample 6 of Example 12.
Figure 21:
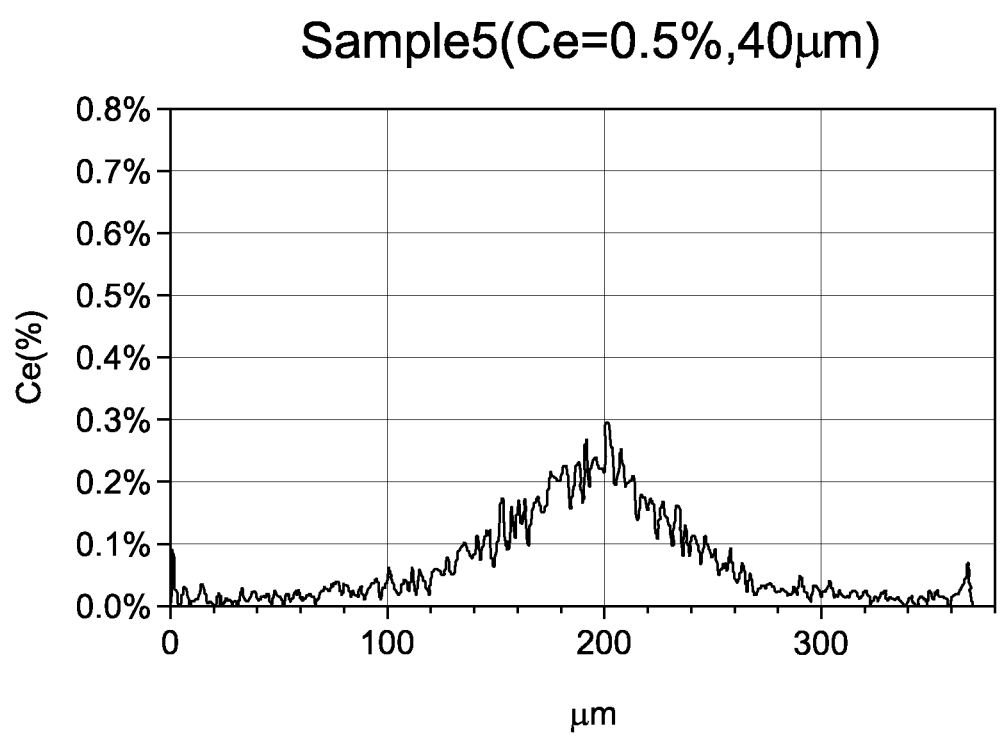
FIG. 21 shows the respective TOF-SIMS profile illustrating the diffusion of Ce % through the emissive region (Ce concentration [%] along the thickness [µm]) for Sample 5 of Example 12.
Figure 22:
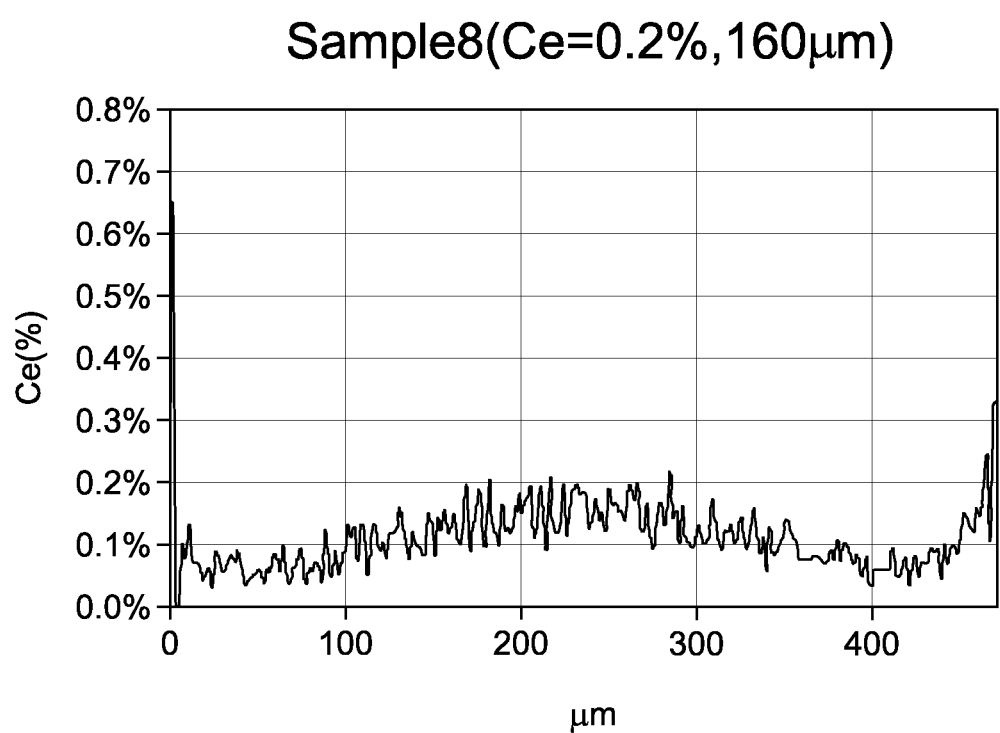
FIG. 22 shows the respective TOF-SIMS profile illustrating the diffusion of Ce % through the emissive region (Ce concentration [%] along the thickness [µm]) for Sample 8 of Example 12.
Figure 23:
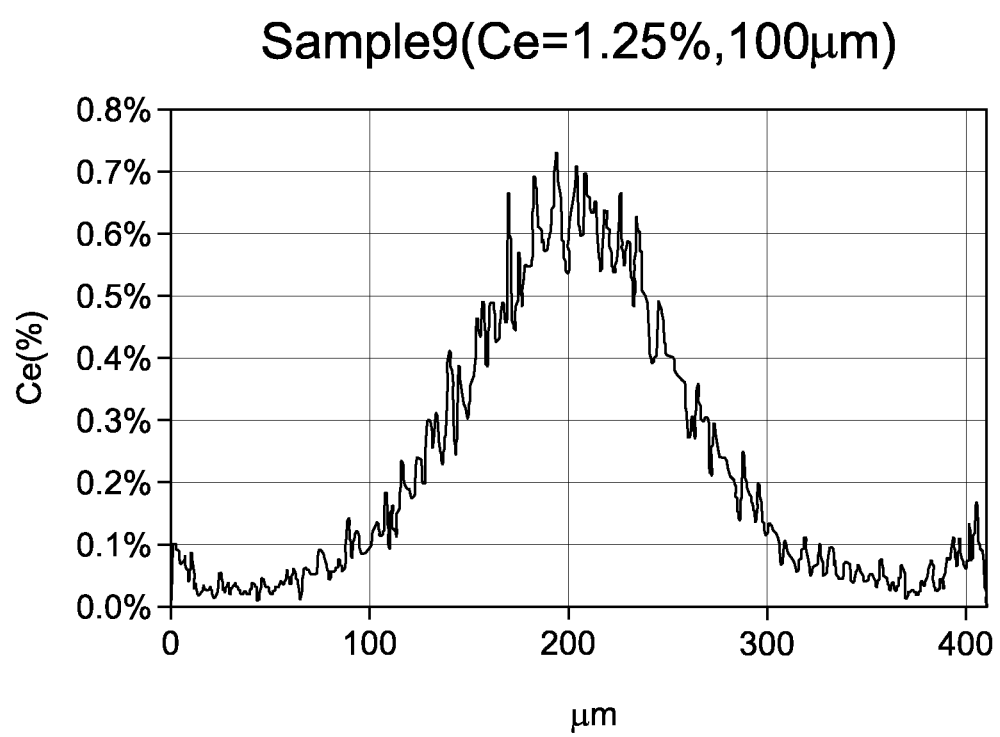
FIG. 23 shows the respective TOF-SIMS profile illustrating the diffusion of Ce % through the emissive region (Ce concentration [%] along the thickness [µm]) for Sample 9 of Example 12.
Figure 24:
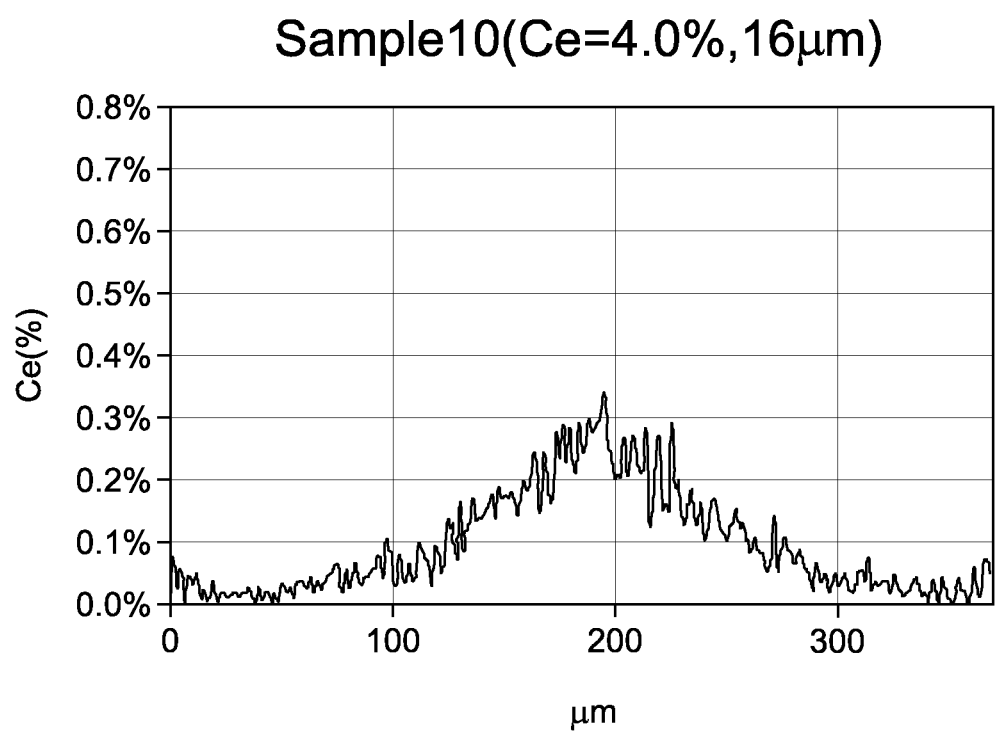
FIG. 24 shows the respective TOF-SIMS profile illustrating the diffusion of Ce % through the emissive region (Ce concentration [%] along the thickness [µm]) for Sample 10 of Example 12.

Ion images (Al+, Ce+, Y+ etc.) were first prepared. Then, profile curves of each ion along the thickness direction of the ceramics were reconstructed from the ion images. A calibration curve, which represents a relation between signal intensity and the ion concentration was created. Establishment of the calibration curve, as shown in FIG. 18, provided by plotting the signal intensity of the TOF-SIMS instrument with a plurality of standard samples of known ion concentration. The actual atomic percent of Ce+ ion along the thickness direction of each YAG:Ce ceramic plate was eventually analyzed with this calibration curve.

FIGS. 19-24 show the respective TOF-SIMS profiles of Samples 5-10 in Example 11. The Ce+ TOF-SIMS profiles of Sample 8 and Sample 9 are distinctly different from those of Samples 5-7.

Example 13

Doped Layer with Polymer Beads

A 50 ml high purity $Al_2O_3$ ball mill jar was filled with 55 g of $Y_2O_3$-stabilized $ZrO_2$ balls having a 3 mm diameter. In a 20 ml glass vial, 0.153 g dispersant (Flowlen G-700. Kyoeisha), 2 ml xylene (Fisher Scientific, Laboratory grade) and 2 ml ethanol (Fisher Scientific, reagent alcohol) were mixed until the dispersant was dissolved completely. The dispersant solution and tetraethoxysilane as sintering aid (0.038 g, Fluka) were added to a ball mill jar.

$Y_2O_3$ powder (3.94 g, 99.99%, lot N-YT4CP, Nippon Yttrium Company Ltd.) with a BET surface area of 4.6 $m^2/g$ and $Al_2O_3$ powder (3.00 g, 99.99%, grade AKP-30, Sumitomo Chemicals Company Ltd.) with a BET surface area of 6.6 $m^2/g$ and $Ce(NO_3)_3 6H_2O$ (0.153 g, 99.99%,Aldrich) were added to ball mill jar. The total powder weight was 7.0 g and the ratio of $Y_2O_3$ to $Al_2O_3$ was at a stoichiometric ratio of 3:5. A first slurry was produced by mixing the $Y_2O_3$ powder, the $Al_2O_3$ powder, the $Ce(NO_3)_3 6H_2O$, dispersant, tetraethoxysilane, xylenes, and ethanol by ball milling for 24 hours.

A solution of binder and plasticizers was prepared by dissolving 3.5 g poly(vinyl butyral-co-vinyl alcohol-co-vinyl acetate) (Aldrich), 1.8 g benzyl n-butyl phthalate (98%, Alfa Aesar), and 1.8 g polyethylene glycol (Mn=400, Aldrich) in 12 ml xylene (Fisher Scientific, Laboratory grade) and 12 ml ethanol (Fisher Scientific, reagent alcohol). A second slurry was produced by adding 4 g of the binder solution into the first slurry and then milling for another 24 hours. When ball milling was complete, the second slurry was passed through a syringe-aided metal screen filter with pore size of 0.05 mm.

A 50 ml high purity $Al_2O_3$ ball mill jar was filled with 15 g of $Y_2O_3$-stabilized $ZrO_2$ balls having a 3 mm diameter. 10 g second slurry and 0.081 g polymeric beads (1 μm, Cross-linked-polymethylmethacrylate resin, Nippon Shokubai, Epostar MA1001) were added into the $Al_2O_3$ ball mill jar and then milling for 4 hrs. Viscosity of the slurry was adjusted to 400 centipoise (cP) by evaporating solvents in the slurry while stirring at room temperature. The slurry was then cast on a releasing substrate, e.g., silicone coated Mylar® carrier substrate (Tape Casting Warehouse) with an adjustable film applicator (Paul N. Gardner Company, Inc.) at a cast rate of 30 cm/min. The blade gap on the film applicator was set at 0.127 mm (5 mil). The cast tape was dried overnight at ambient atmosphere to produce a green sheet of about 50 μm thickness.

Example 14

Non-Doped Layer with Polymer Beads

A 50 ml high purity $Al_2O_3$ ball mill jar was filled with 55 g of $Y_2O_3$-stabilized $ZrO_2$ balls having a 3 mm diameter. In a 20 ml glass vial, 0.153 g dispersant (Flowlen G-700. Kyoeisha), 2 ml xylene (Fisher Scientific, Laboratory grade) and 2 ml ethanol (Fisher Scientific, reagent alcohol) were mixed until the dispersant was dissolved completely. The dispersant solution and tetraethoxysilane as sintering aid (0.038 g, Fluka) were added to a ball mill jar.

$Y_2O_3$ powder (3.94 g, 99.99%, lot N-YT4CP, Nippon Yttrium Company Ltd.) with a BET surface area of 4.6 $m^2/g$ and $Al_2O_3$ powder (3.00 g, 99.99%, grade AKP-30, Sumitomo Chemicals Company Ltd.) with a BET surface area of 6.6 $m^2/g$ were added to ball mill jar. The total powder weight was 7.0 g and the ratio of $Y_2O_3$ to $Al_2O_3$ was at a stoichiometric ratio of 3:5. A first slurry was produced by mixing the $Y_2O_3$ powder, the $Al_2O_3$ powder, tetraethoxysilane, xylenes, and ethanol by ball milling for 24 hours.

A solution of binder and plasticizers was prepared by dissolving 3.5 g poly(vinyl butyral-co-vinyl alcohol-co-vinyl acetate) (Aldrich), 1.8 g benzyl n-butyl phthalate (98%, Alfa Aesar), and 1.8 g polyethylene glycol (Mn=400, Aldrich) in 12 ml xylene (Fisher Scientific, Laboratory grade) and 12 ml ethanol (Fisher Scientific, reagent alcohol). A second slurry was produced by adding 4 g of the binder solution into the first slurry and then milling for another 24 hours. When ball milling was complete, the second slurry was passed through a syringe-aided metal screen filter with pore size of 0.05 mm.

A 50 ml high purity $Al_2O_3$ ball mill jar was filled with 15 g of $Y_2O_3$-stabilized $ZrO_2$ balls having a 3 mm diameter. 10 g second slurry and 2.284 g polymeric beads (4 μm, Cross-linked-polymethylmethacrylate resin, Nippon Shokubai, Epostar MA1004) were added into the $Al_2O_3$ ball mill jar and then milling for 4 hrs. Viscosity of the slurry was adjusted to 400 centipoise (cP) by evaporating solvents in the slurry while stirring at room temperature. The slurry was then cast on a releasing substrate, e.g., silicone coated Mylar® carrier substrate (Tape Casting Warehouse) with an adjustable film applicator (Paul N. Gardner Company, Inc.) at a cast rate of 30 cm/min. The blade gap on the film applicator was set at 0.101 mm (4 mil). The cast tape was dried overnight at ambient atmosphere to produce a green sheet of about 40 μm thickness.

Example 15

Emissive Ceramics with Porous Layers

Two kinds of non-doped layers (e.g., un-doped host material) including $Y_2O_3$ and $Al_2O_3$ powders at an atomic ratio of 3:5, one with a thickness of 100 μm and without polymer beads, and another having a thickness of bout 40 μm with 60 vol % of polymer beads of 4 μm, which were inserted between doped layers and non-doped layers containing no polymer beads for the purpose of improving angular dependence of chromaticity by scattering of photoluminescence. The doped layers include $Y_2O_3$ and $Al_2O_3$ containing about 1.0 at % Ce (50 μm thickness) and 5 vol % polymer beads with size of 1 μm to reduce the outcoupling loss of photoluminescence by waveguide effect. These layers were cut into circular shapes of about 13 mm in diameter with laser cutter. A symmetrical configuration of laminate composite was constituted as set forth in Table 3.

TABLE 3

Assembly Configurations

| Layer | | Beads loading (vol %) | Beads size (μm) | Thickness (μm) | Composition |
|---|---|---|---|---|---|
| 1 | Non-emissive | 0 | — | 100 | $Y_3Al_5O_{12}$ |
| 2 | Non-emissive | 60 | 4 | 40 | $Y_3Al_5O_{12}$ |
| 3 | Emissive | 5 | 1 | 50 | $(Y_{0.99}Ce_{0.01})_3Al_5O_{12}$ |
| 4 | Non-emissive | 60 | 4 | 40 | $Y_3Al_5O_{12}$ |
| 5 | Non emissive | 0 | — | 100 | $Y_3Al_5O_{12}$ |

The respective pieces of punched circular-shaped undoped green sheet and doped green sheet were placed between circular dies with mirror-polished surfaces and heated on a hot plate to 80° C., followed by compression in a hydraulic press at a uniaxial pressure of 5 metric tons and held at that pressure for 5 minutes. Laminated composites of doped and non-doped layers were thus produced.

For debindering, the assembly was sandwiched between $ZrO_2$ cover plates (1 mm in thickness, grade 42510-X, ESL Electroscience Inc.) and placed on an $Al_2O_3$ plate of 5 mm thick; then heated in a tube furnace in air at a ramp rate of 0.5° C./min to 800° C. and held for 2 hours to remove the organic components from the green sheets. In this process, porous structure formed in part of layer containing polymer beads by burn-out of polymer components.

After debindering, the assembly was annealed at 1500° C. at 20 Torr for 5 hours at a heating rate of 1° C./min to complete conversion from non-garnet phases of Y—Al—O in the non-emissive layer, including, but not limited to, amorphous yttrium oxides, YAP, YAM or $Y_2O_3$ and $Al_2O_3$ to yttrium aluminum garnet (YAG) phase and increase the final YAG grain size.

Following the first annealing, the assembly were further sintered in a vacuum of $10^{-3}$ Torr at about 1700° C. for 5 hours at a heating rate of 5° C./min and a cooling rate of 10° C./min to room temperature to produce a translucent YAG ceramic sheet of about 0.4 mm thickness. Brownish sintered ceramic sheets were reoxidized in a furnace at 20 Torr at 1400° C. for 2 hrs at heating and cooling rates of 10° C./min and 20° C./min 20 Torr respectively. The sintered laminated composite exhibited transmittance greater than 50% at 800 nm. When irradiated with a blue LED with peak emission wavelength at 455 nm, no clear boundary between emissive and non-emissive layer can be observed, which indicates that significant diffusion of cerium occurred from the doped plasma YAG layer to the non-doped YAG layer.

Example 16

IQE and Angular Dependence Measurement Results of Laminate Composite

IQE measurement was performed using the equipment and setup as described in EXAMPLE 6. The IQE of the laminated composite sample produced according to Example 15 having the porous layers was 90%.

Figure 26:
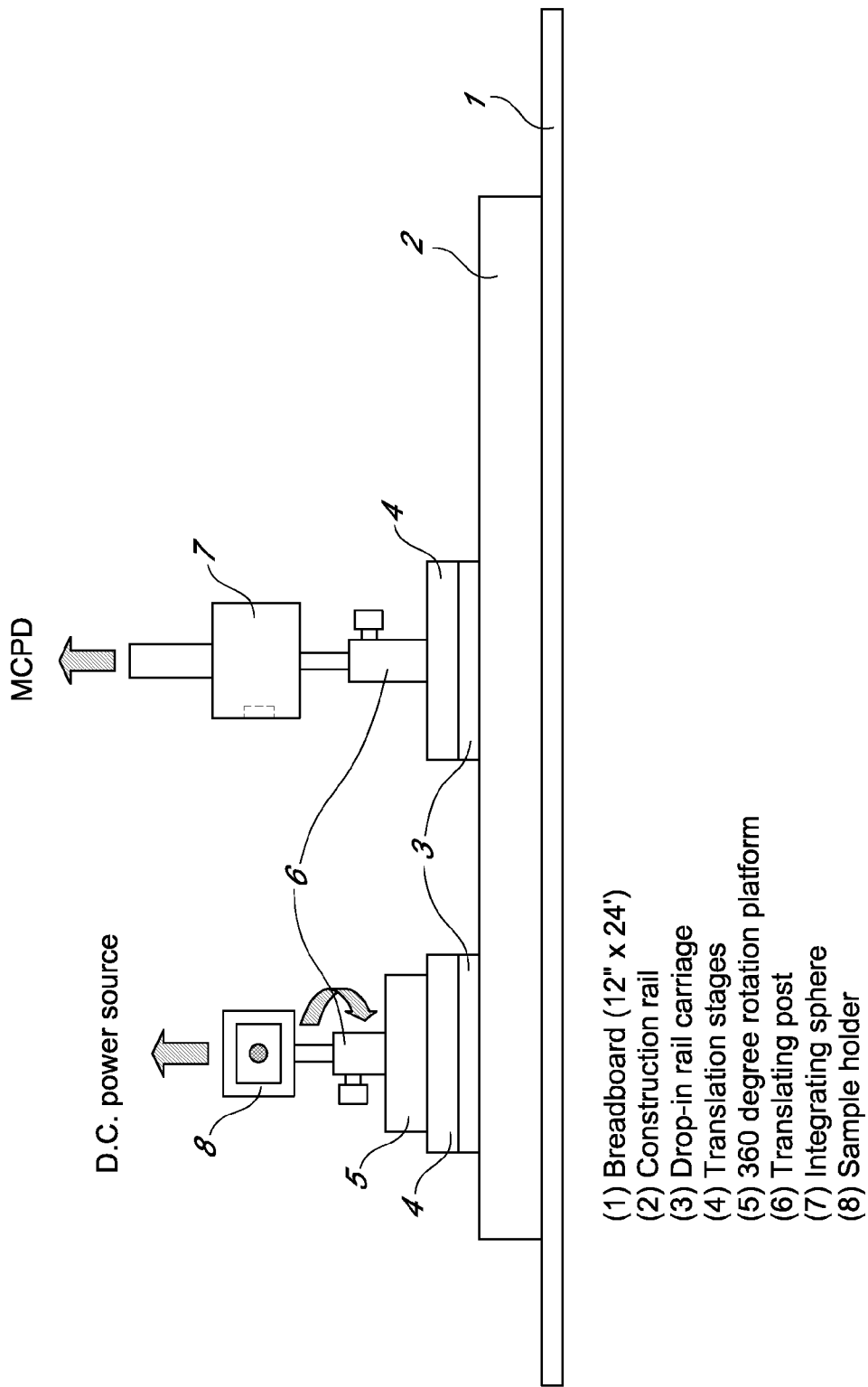
FIG. 26 shows the setup for measuring the angular dependence of chromaticity for emissive ceramics.

A setup as shown in FIG. 26 was used for measuring angular dependence of chromaticity coordinate for the YAG phosphor ceramics. The setup comprises a high sensitivity multichannel photodetector and an integrating sphere (OTSUKA ELECTRONICS, Osaka Japan) for collecting the photoluminescence signal. A 360 degree rotation platform and translation stages allowed the variation of angle of photoluminescence source with respect to the integrating sphere in the range of 0 to 360 degree. Phosphor ceramics diced into 1.0 mm by 1.0 mm was attached to blue LED source (Cree Inc.) by silicone resin and cured at 150° C. for 1 hr in ambient atmosphere to form a LED module. The LED module was mounted on to a sample holder attached to the rotation platform. To measure the angular dependence, DC voltage of 3.0 V and current of 0.1 A was applied to the LED module. Starting at 0 degree defined as the position with YAG ceramics surface facing the normal to integrating sphere, photoluminescence of YAG ceramics was recorded at 10 degree interval clockwise and counter-clockwise to 90 degree, meaning the edge of YAG ceramics directed to the integrating sphere.

Figure 27:
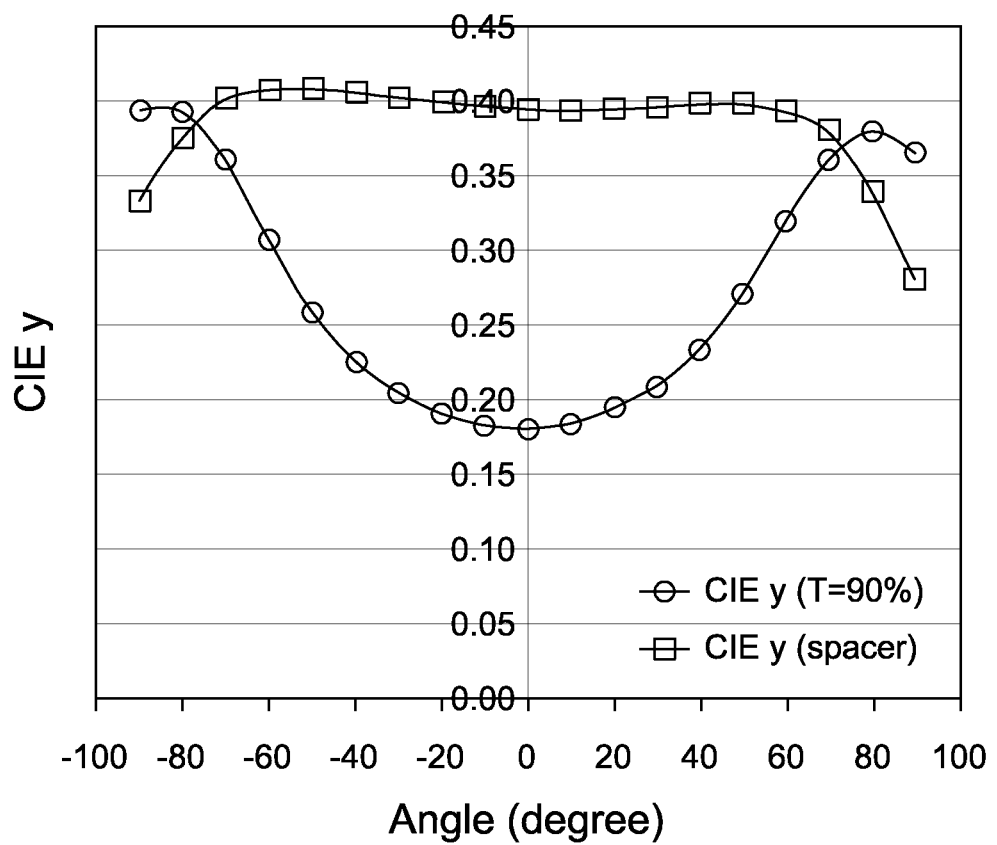
FIG. 27 shows the results for measuring the angular dependence of chromaticity. The squares represent measurements for the emissive ceramic prepared in Example 15. The circles represent measurement for the emissive ceramic prepared in Example 11.

Angular dependence of YAG ceramics was obtained by plotting the chromaticity coordinate against angle as shown in FIG. 27. The square data points were measured for the emissive ceramic prepared according to Example 15, while the circle data points were measured for the emissive ceramic prepared according to Example 11 (i.e., without any porous regions). As is clear from FIG. 27, including the porous regions in the emissive ceramic improves the isotropy of the light emitting properties.

What is claimed is:

1. An emissive ceramic comprising a yttrium aluminum garnet (YAG) region and a dopant having a concentration gradient along a thickness of the YAG region between a first surface and a second surface, wherein said concentration gradient comprises a maximum dopant concentration, a first half-maximum dopant concentration, and a first slope at or near the first half-maximum dopant concentration, wherein an absolute value of the first slope is in the range of about 0.001 and about 0.004 (at %/μm).

2. The emissive ceramic of claim 1, wherein the maximum dopant concentration is in the range of about 0.25 at % to about 0.5 at %.

3. The emissive ceramic of claim 1, wherein the maximum dopant concentration is located no more than about 100 μm away from the first or second surface.

4. The emissive ceramic of claim 1, wherein the maximum dopant concentration is located no more than about 100 μm away from the center of the thickness of the YAG region.

5. The emissive ceramic of claim 1, wherein the first half-maximum dopant concentration is located at least about 25 μm away from the location of the maximum dopant concentration.

6. The emissive ceramic of claim 1, wherein the first half-maximum dopant concentration is located at least 50 μm away from the first and second surfaces.

7. The emissive ceramic of claim 1, further comprising a second half-maximum dopant concentration located at least 25 μm away from the location of the first half-maximum dopant concentration.

8. The emissive ceramic of claim 7, further comprising a second slope at or near the second half-maximum dopant concentration, wherein an absolute value of the second slope is in the range of 0.001 and 0.004 (at %/μm).

9. The emissive ceramic of claim 8, wherein the absolute value of the first slope is about the same as the absolute value of the second slope.

10. The emissive ceramic of claim 1, wherein the dopant concentration gradient comprises a peak having a full-width at half-maximum in the range of about 50 μm to about 400 μm.

11. The emissive ceramic of claim 1 wherein the YAG region further comprises a first porous region.

12. The emissive ceramic of claim 11, wherein the first porous region has a pore volume in the range of about 0.5% to about 80%.

13. The emissive ceramic of claim 11, wherein the first porous region comprises pores having an average size in the range of about 0.5 μm to about 50 μm.

14. The emissive ceramic of claim 11, wherein the YAG region further comprises a first non-porous region and a second non-porous region, and wherein the first porous region is disposed between the first non-porous region and the second non-porous region.

15. The emissive ceramic of claim 11, wherein the YAG region further comprises a first non-porous region and a second porous region, and wherein the first non-porous region is disposed between the first porous region and the second porous region.

16. The emissive ceramic of claim 11, wherein the first porous region has a thickness in the range of about 10 μm to about 400 μm.

17. An emissive ceramic comprising a yttrium aluminum garnet (YAG) region and a dopant having a concentration gradient along a thickness of the YAG region, wherein said concentration gradient comprises a maximum dopant concentration, a first half-maximum dopant concentration, and a first slope at or near the first half-maximum dopant concentration, wherein an absolute value of the first slope is in the range of about one-eighth of the maximum dopant concentration divided by the thickness and about two times the maximum dopant concentration divided by the thickness.

18. The emissive ceramic of claim 17, wherein the maximum dopant concentration is located between about one-quarter and about three-quarters along the thickness of the YAG region.

19. The emissive ceramic of claim 17, wherein the emissive ceramic exhibits an internal quantum efficiency (IQE) of at least about 0.80 when exposed to radiation having a wavelength of about 455 nm.

* * * * *